(12) United States Patent
Takei et al.

(10) Patent No.: US 7,420,322 B2
(45) Date of Patent: Sep. 2, 2008

(54) DISPLAY DEVICE INCLUDING A FLAT PANEL DISPLAY PANEL

(75) Inventors: Manabu Takei, Sagamihara (JP); Tomoyuki Shirasaki, Higashiyamato (JP)

(73) Assignee: Casio Computer Co., Ltd., Tokyo (JP)

( * ) Notice: Subject to any disclaimer, the term of this patent is extended or adjusted under 35 U.S.C. 154(b) by 297 days.

(21) Appl. No.: 10/874,030

(22) Filed: Jun. 21, 2004

(65) Prior Publication Data

US 2004/0263039 A1 Dec. 30, 2004

(30) Foreign Application Priority Data

Jun. 27, 2003 (JP) ............... 2003-185239
Jun. 27, 2003 (JP) ............... 2003-185281

(51) Int. Cl.
*H01J 1/62* (2006.01)
(52) U.S. Cl. ............. 313/500; 313/506; 313/505; 313/504; 313/498
(58) Field of Classification Search ......... 313/110–112, 313/500
See application file for complete search history.

(56) References Cited

U.S. PATENT DOCUMENTS

| | | | | |
|---|---|---|---|---|
| 5,854,872 A | * | 12/1998 | Tai | 362/302 |
| 6,121,726 A | * | 9/2000 | Codama et al. | 313/504 |
| 6,211,613 B1 | * | 4/2001 | May | 313/504 |
| 6,215,245 B1 | * | 4/2001 | Mori | 313/503 |
| 6,288,487 B1 | * | 9/2001 | Arai | 313/504 |
| 6,339,289 B1 | * | 1/2002 | Fork | 313/506 |
| 6,617,613 B2 | * | 9/2003 | Matsuo et al. | 257/79 |
| 2003/0058390 A1 | * | 3/2003 | Fujii | 349/113 |
| 2004/0007965 A1 | * | 1/2004 | Kijima et al. | 313/495 |
| 2007/0242184 A1 | * | 10/2007 | Ohta et al. | 349/64 |
| 2008/0055929 A1 | * | 3/2008 | Kuroda et al. | 362/609 |

FOREIGN PATENT DOCUMENTS

| | | | |
|---|---|---|---|
| JP | 9-326297 A | | 12/1997 |
| JP | 09326297 A | * | 12/1997 |
| JP | 10031104 A | * | 2/1998 |
| JP | 2000-322000 A | | 11/2000 |
| JP | 2002-6776 A | | 1/2002 |
| KR | 2001063920 A | * | 7/2001 |

* cited by examiner

*Primary Examiner*—Sikha Roy
*Assistant Examiner*—Natalie K Walford
(74) *Attorney, Agent, or Firm*—Frishauf, Holtz, Goodman & Chick, P.C.

(57) ABSTRACT

A display device includes a flat display panel in which a plurality of pixels are arrayed in a matrix at an interval and covered with an optically transparent material, and an optical sheet to impart the front directivity of the flat display panel. Light which is emitted from a predetermined one of the plurality of pixels and emerges outside from the surface of the optical sheet located on a region except the pixel to the front direction overlaps neighboring pixels arranged around the pixel in a width equal to or smaller than 20% of the pixel width of the neighboring pixels.

13 Claims, 15 Drawing Sheets

DISPLAY DEVICE INCLUDING A FLAT PANEL DISPLAY PANEL

CROSS-REFERENCE TO RELATED APPLICATIONS

This application is based upon and claims the benefit of priority from prior Japanese Patent Applications No. 2003-185239, filed Jun. 27, 2003; and No. 2003-185281, filed Jun. 27, 2003, the entire contents of both of which are incorporated herein by reference.

BACKGROUND OF THE INVENTION

1. Field of the Invention

The present invention relates to a display device which uses a flat display panel, such as an electro-luminescent (EL) display panel.

2. Description of the Related Art

Research and development of flat display panels is flourishing in recent years. Flat display panels include liquid crystal display panels using transmission light, plasma display panels using discharge phenomena, field emission display panels, and EL display panels using electroluminescence. All display panels which display an image by using a dot matrix have a plurality of pixels arranged in a matrix.

To increase the visibility of a flat display panel, its surface is sometimes optically processed. For example, to suppress reflection of external light on the display surface of a flat display panel, an AR (Anti-Reflection) coating is applied to the display surface. Jpn. Pat. Appln. KOKAI Publication No. 2000-322000 discloses a technique for forming a microlens array on the display surface of a flat display panel to increase its light emission ratio. Alternatively, to increase both the surface directivity and the luminance of a flat display panel, a prism sheet having a number of prisms with triangular sections is bonded to the display surface of the flat display panel.

When an optical means such as a microlens array or a prism sheet is arranged on the display surface of a flat display panel, the emission ratio of light toward the front side increases. On the other hand, if, e.g., a red pixel (R) radially emits light, and a light component that has reached the upper portion of an adjacent green pixel (G) is refracted or reflected by the optical means opposing the green pixel (G) and emerges to the front side, the light that emerges from the red pixel (R) diverges to the green pixel (G) which actually emits green light. For this reason, the area where only the color of the green pixel (G) can be seen becomes small.

BRIEF SUMMARY OF THE INVENTION

The present invention has an advantage in suppressing light emitted from a predetermined pixel from being emitted from an adjacent pixel.

To obtain the above advantage, according to a first aspect of the present invention, there is provided a display device comprising:

a flat display panel in which a plurality of pixels are arrayed in a matrix at an interval and covered with an optically transparent material; and an optical sheet to impart a front directivity of the flat display panel, wherein light which is emitted from a predetermined one of the plurality of pixels and emerges outside from a surface of the optical sheet located on a region except the pixel to a front direction overlaps neighboring pixels arranged around the pixel in a width of not more than 20% of a pixel width of the neighboring pixels.

In this device, the light which emerges outside from the surface of the optical sheet located on the region except the predetermined pixel to the front direction overlaps at maximum only 20% of the width of the neighboring pixel. Hence, the area where the display colors of the neighboring pixels are canceled by color mixture can be suppressed, and a satisfactory display can be obtained.

According to another aspect, there is provided a display device in which the optical sheet has a plurality of prisms having a sharpness α, and a vertical height d from the pixel to a light emerging position of a surface of the optical sheet is set to satisfy $$\frac{d}{p} \leq \tan\left(\frac{\alpha}{2} + \sin^{-1}\left(\frac{1}{n}\sin\frac{\pi-\alpha}{2}\right)\right) \quad (1)$$

where n is a refractive index of an optical path from the pixel to the light emerging position of the surface of the optical sheet, and p is a horizontal width from the pixel to the light emerging position of the surface of the optical sheet.

In this case, the vertical height d from the pixel to the light emerging position of the surface of the optical sheet can easily be calculated in accordance with the sharpness α of the optical sheet to be applied and the horizontal width p from the pixel to the light emerging position of the surface of the optical sheet, which is set by the optical sheet. When a height d is set, a satisfactory display can be executed.

According to a further aspect, there is provided a display device comprising:

a flat display panel in which a plurality of pixels are arrayed in a matrix at an interval and covered with an optically transparent material; and a plurality of optical elements which have a predetermined shape and are arrayed on a surface of the optically transparent material to impart a front directivity of the flat display panel, wherein a pitch of the plurality of optical elements may be smaller than a pitch of the plurality of pixels.

Since the pitch of the plurality of optical elements is smaller than the pitch of the plurality of pixels, one or more optical elements opposes each pixel. Light emitted from one pixel emerges from each optical element. Hence, color mixture between adjacent pixels on the display screen can be prevented.

According to another aspect, there is provided a display device comprising:

a flat display panel which has pixels arranged in a matrix at an interval, a mesh-shaped partition which divides regions of the plurality of pixels into a plurality of cells arrayed in a matrix in correspondence with the plurality of pixels, and an optically transparent material which fills the plurality of cells divided by the partition; and a plurality of optical elements which have a predetermined shape and are arrayed on surfaces of the optically transparent material and the partition to impart a front directivity of the flat display panel. Light emerging from each pixel is shielded by the partition and therefore does not enter a cell corresponding to an adjacent pixel. For this reason, color mixture between adjacent pixels on the display screen can be prevented.

According to a further aspect, there is provided a display device comprising:

a flat display panel in which a plurality of pixels are arrayed in a matrix at an interval and covered with an optically transparent material; and an optical member which is arranged on a surface of the optically transparent material to impart an optical characteristic to the flat display panel, wherein each pixel has a structure in which an optically transparent electrode which passes light, an EL layer which causes electroluminescence, and a reflection suppressing layer to suppress reflection of light on an interface to the EL layer are formed sequentially from a side of the optically transparent material.

The optical member is arranged on the display surface of the flat display panel, i.e., the surface of the optically transparent material. When light emitted from the EL layer of a given pixel becomes incident on the optical member through the optically transparent electrode and optically transparent material, the light becomes incident on the reflection suppressing layer of another pixel by the retroreflection effect of the optical member. Since reflection is suppressed by the reflection suppressing layer, the light emitted from the EL layer of the given pixel can be suppressed from being reflected by another pixel. For this reason, color mixture between adjacent pixels can be reduced, and a clear image can be displayed.

DETAILED DESCRIPTION OF THE INVENTION

Preferred embodiments of the present invention will be described below with reference to the accompanying drawing. The embodiments described below include various kinds of limitations which are preferable in terms of techniques for practicing the present invention. However, the scope of the present invention is not limited to the following embodiments and illustrated examples. In the following description, "viewed from the upper side" means "viewed perpendicularly to the display surface".

Figure 1:
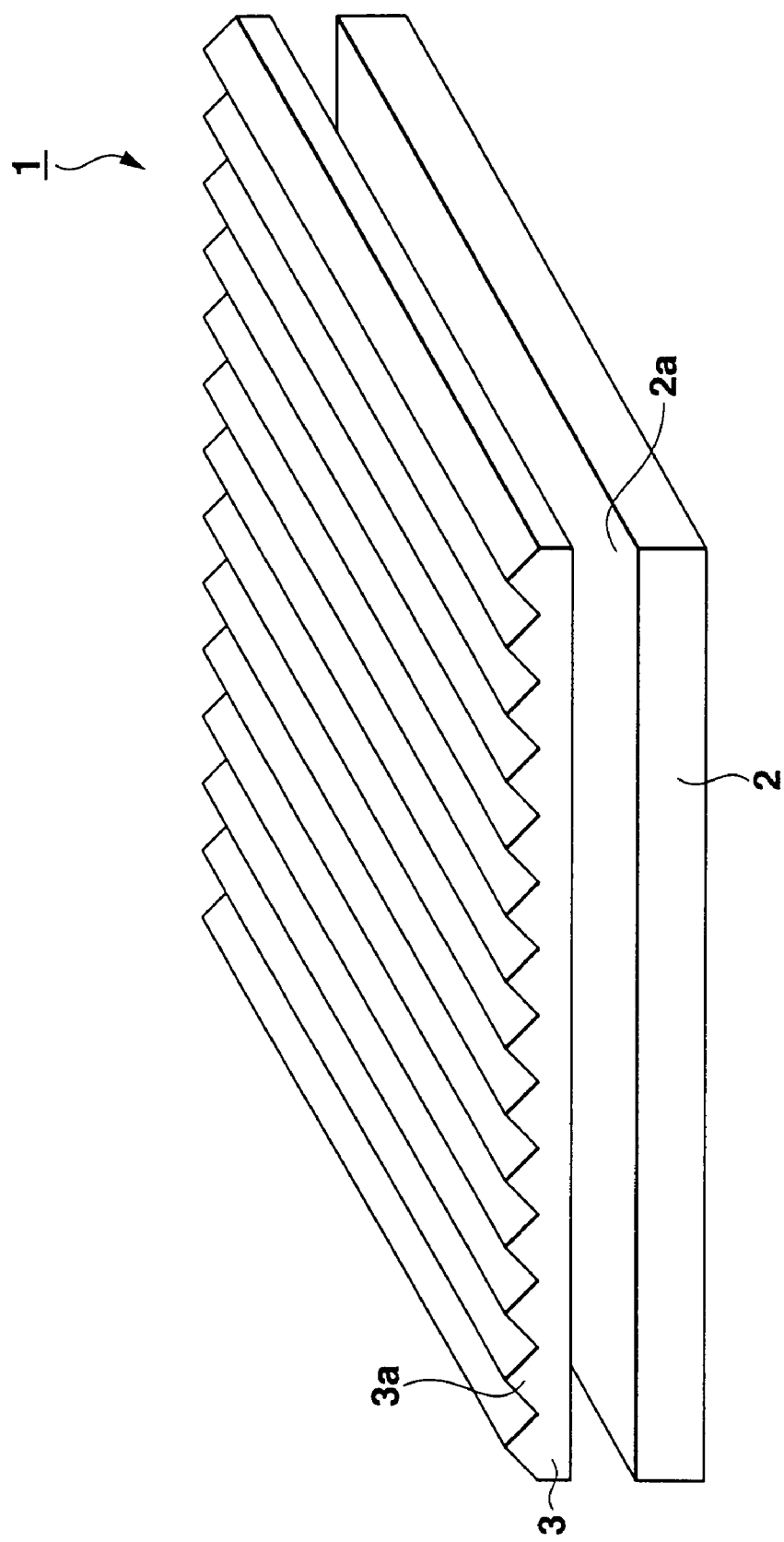
FIG. 1 is an exploded perspective view of an EL display device according to the first embodiment of the present invention.

FIG. 1 is an exploded perspective view of a display device 1 according to an embodiment of the present invention. As shown in FIG. 1, the display device 1 comprises a flat display panel 2 and an optical sheet (prism sheet) 3. In the flat display panel 2, a plurality of pixels are arrayed in a matrix including m (natural number; m≧2) pixels in the column direction and n (natural number; n≧2) pixels in the row direction. The optical sheet 3 is bonded to a light emerging surface (display surface) 2a of the flat display panel 2 to impart a front directivity to its display light.

Figure 2A:
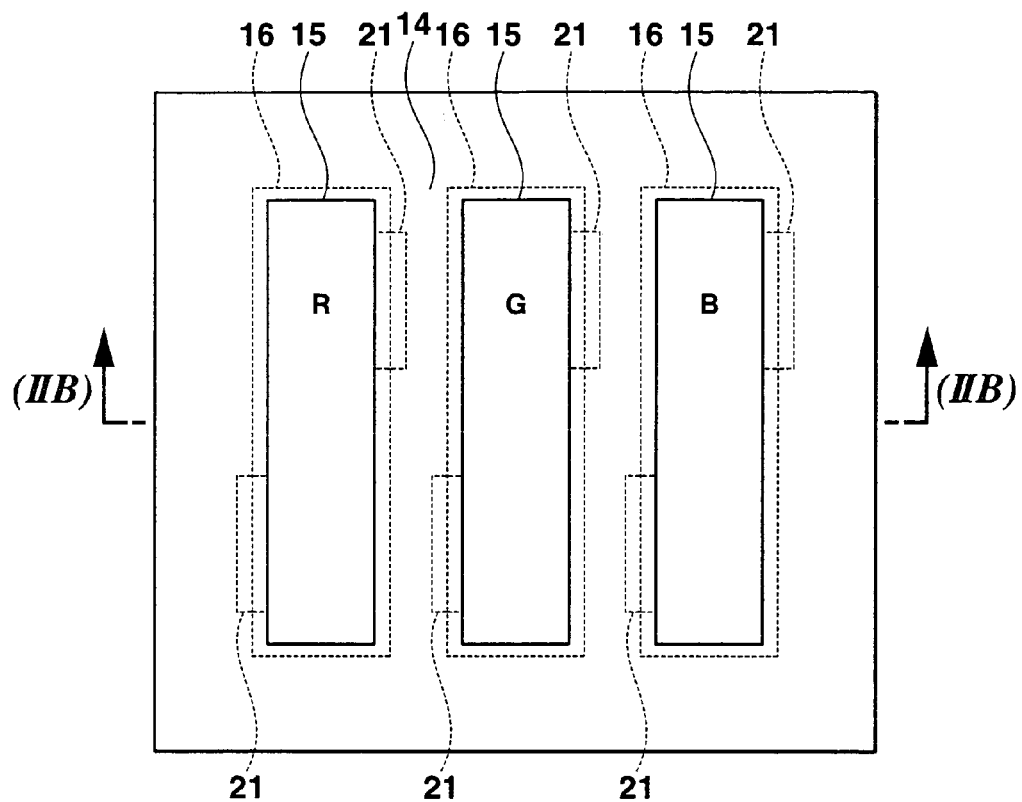
FIG. 2A is a plan view of the EL display device shown in FIG. 1.
Figure 2B:
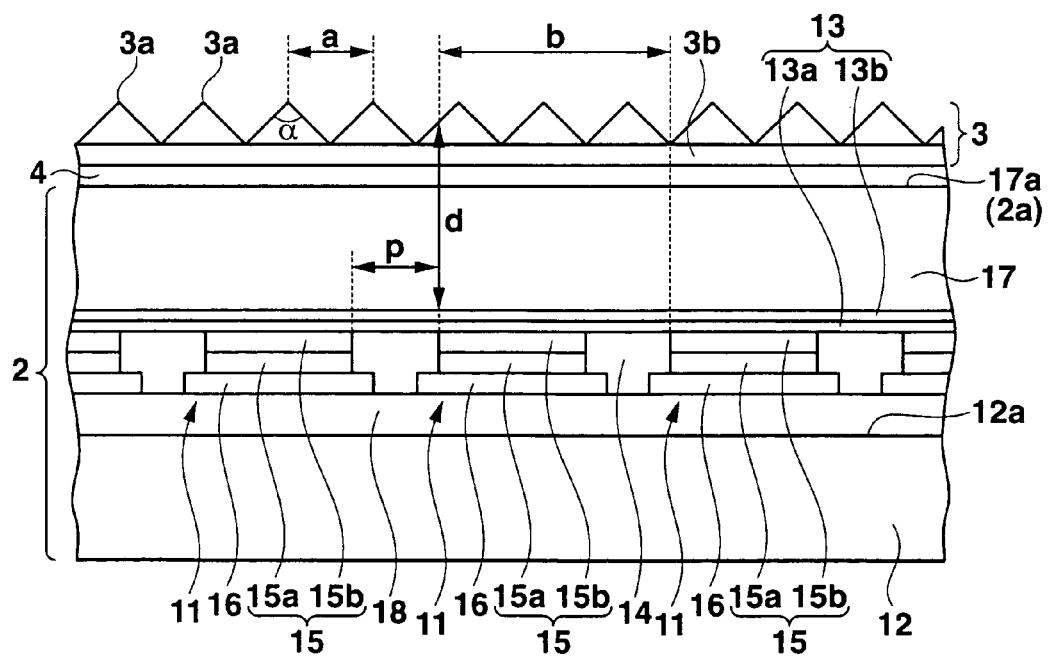
FIG. 2B is a sectional view taken along a line (IIB)-(IIB) in FIG. 2A.

The flat display panel 2 will be described first with reference to FIGS. 2A and 2B. FIG. 2A is a plan view showing, of the plurality of pixels arrayed in a matrix, three pixels adjacent in the horizontal direction. FIG. 2B is a sectional view taken along a line IIB-IIB in FIG. 2A.

As a pixel of the flat display panel 2, an EL element 11 as a selfluminous element is used. Two transistors 21 are arranged in each EL element 11 which forms one pixel. The flat display panel 2 executes dot matrix display by active matrix driving. The flat display panel may be of a current gray level display type which controls the gray level by the current value of a current that flows to one of the transistors 21. Alternatively, the flat display panel may be of a voltage gray level display type which controls the gray level by the voltage value of a voltage applied to one of the transistors 21. The number of transistors per pixel need not always be two and may be three or more.

The flat display panel 2 comprises a substrate 12. The substrate 12 has a flat plate shape and is made of borosilicate glass, silica glass, glass of any other type, PMMA, polycarbonate, or any other resin.

A plurality of scanning lines (not shown) formed into a band shape long in the row direction are arrayed in parallel on a surface 12a of the substrate 12. These scanning lines are covered with an insulating film (not shown). A plurality of signal lines formed into a band shape long in the column direction are arrayed on the insulating film in parallel in a direction perpendicular to the scanning lines. The transistors 21 are formed on the surface 12a of the substrate 12. The transistors 21 are preferably MOSFET thin-film transistors. The gate electrode of one of the two transistors 21 in each pixel is connected to the scanning line. The drain electrode of the other transistor 21 is commonly connected to the signal line. The transistor 21 can have either an inverted staggered structure or a coplanar structure. The transistor 21 may be either an n-channel transistor or a p-type transistor. The transistor 21 may be formed by either an amorphous silicon TFT or a polysilicon TFT.

The two transistors 21 in each pixel form a pixel circuit which receives signals for a data driver and a scan driver through the signal line and the scanning line and holds the current value of a current flowing to the EL element 11 in accordance with the received signals until the next period, thereby holding a constant light emission luminance of the EL element 11.

All transistors 21 of the pixels are covered with an insulating coating film 18. The insulating coating film 18 is formed almost over the entire surface 12a of the substrate 12. Steps generated between the transistors 21 and the surface 12a of the substrate 12 are relaxed by the insulating coating film 18 so that it has an almost flat surface. The insulating coating film 18 is made of an organic resin (e.g., acrylic resin (including methacrylate resin) or epoxy resin) or an inorganic compound such as silicon oxide or silicon nitride. To prevent photo-deterioration of the transistors 21, the insulating coating film 18 preferably has a light-shielding effect, if it contains a pigment such as carbon black.

The EL elements 11 are formed on the insulating coating film 18. Each of the EL elements 11 has a multilayered structure in which a pixel electrode 16 serving as an anode, an EL layer 15 which causes electroluminescence, and a common electrode 13 serving as a cathode are stacked in this order. The pixel electrode 16 and EL layer 15 are formed independently for each EL element 11. The plurality of pixel electrodes 16 and the plurality of EL layers 15 are arrayed in a matrix when viewed from the upper side. The common electrode 13 is formed commonly for the plurality of EL elements 11 and formed on the substantially entire surface of the substrate 12 when viewed from the upper side.

The pixel electrode 16 is made of a conductive material such as a metal, a metal oxide, or an alloy. The material has preferably a relatively high work function. The pixel electrode 16 is made of, e.g., indium oxide, zinc oxide, tin oxide, or a mixture containing at least one of them (e.g., indium tin oxide (ITO), indium zinc oxide, or cadmium tin oxide (CTO)).

The pixel electrode 16 is electrically connected to the source electrode of one transistor 21 in each of the pixels through a contact hole formed in the insulating coating film 18.

The EL layer 15 is formed on each pixel electrode 16. The EL layer 15 is made of a light-emitting material and emits light by recombining holes injected from the pixel electrode 16 and electrons injected from the common electrode 13. Referring to FIG. 2A, R (red), G (green), and B (blue) added to the EL elements 11 represent the colors of light emitted by the EL layers 15.

The EL layer 15 may appropriately contain either an electron transport substance or a hole transport substance, or both electron transport and hole transport substances. More specifically, the EL layer 15 may have a three-layered structure including a hole transport layer, a light-emitting layer, and an electron transport layer sequentially formed from the pixel electrode 16. The EL layer 15 may have a two-layered structure sequentially including a hole transport layer and a light-emitting layer or a two-layered structure sequentially including a light-emitting layer and an electron transport layer. Alternately, the EL layer 15 may have a single-layered structure including a light-emitting layer. Alternatively, the EL layer 15 may have a multilayered structure in which an electron or hole injection layer is inserted between appropriate layers in one of the above layer structures. All the layers included in the EL layer 15 may be made of organic compounds, and/or inorganic compounds (e.g., zinc sulfide). For example, the EL layer 15 may be formed by stacking a layer made of an inorganic compound and a layer made of an organic compound. When all the layers included in the EL layer 15 are made of inorganic compounds, an inorganic EL element is formed as the EL element 11. Alternately, when the EL layer 15 includes a layer made of an organic compound, an organic EL element is formed as the EL element 11.

When the EL layer 15 is made of a low molecular weight organic material or an inorganic substance, the EL layer 15 can be formed by epitaxial growth such as deposition or sputtering. When the EL layer 15 is made of a polymer organic material or a low molecular weight organic material, the EL layer 15 can be formed by applying an organic compound containing a liquid (i.e., wet coating). The organic compound containing a liquid is a liquid containing an organic compound as the material of the EL layer 15 or its precursor. The liquid may be a solution prepared by dissolving, as a solute, the organic compound as the material of the EL layer 15 or its precursor in a medium. Alternatively, the liquid may be a dispersion prepared by dispersing the organic compound as the material of the EL layer 15 or its precursor in a dispersion medium.

The EL layer 15 is formed by wet coating and has a two-layered structure in which a hole transport layer 15a made of PEDOT (polythiophene) as a conductive polymer and PSS (polystyrene sulfonate) as a dopant, and a light-emitting layer 15b made of a polyfluorene-based light-emitting material are stacked in this order. When the EL layer 15 is formed by wet coating, preferably, a lyophilic film having a characteristic (to be referred to as a "lyophilic effect" hereinafter) representing that the film surface wets well with a liquid at a contact angle of 40° or less is formed on the pixel electrode 16, and in this state, an organic compound containing a liquid is applied to the lyophilic film.

An insulating film 14 made of a material selected from a photosensitive resin such as polyimide, silicon oxide, and silicon nitride is formed around the EL layers 15. When the insulating film 14 is formed into a mesh shape when viewed from the upper side, a plurality of regions surrounding by parts of the insulating film 14 are arrayed in a matrix, and the EL layers 15 are formed in the surrounding regions. Part of the insulating film 14 overlaps part of the edge of each pixel electrode 16. When the EL layer 15 is to be formed by wet coating, a liquid-repellent film (e.g., a fluorocarbon resin film or a reactive silicon film) having a characteristic (to be referred to as "liquid repellency" hereinafter) in which the film surface repels a liquid and wets with it at a contact angle of 50° or more may be formed on the surface of the insulating film 14.

The common electrode 13 formed on the EL layers 15 is formed over almost the entire surface of the substrate 12. The common electrode 13 has a multilayered structure having an electron injection layer 13a and an auxiliary electrode 13b sequentially formed from the side of the EL layers 15. The electron injection layer 13a is thin enough to pass light and is made of a material having a relatively low work function (e.g., a single metal including magnesium, calcium, lithium, barium, a rare earth metal, or an alloy containing at least one of these substances). The electron injection layer 13a has a thickness less than the visible light wavelength range, i.e., of 10 to 200 nm. The auxiliary electrode 13b is conductive and transparent to visible light. The auxiliary electrode 13b is made of, e.g., indium oxide, zinc oxide, tin oxide, or a mixture containing at least one of them (e.g., indium tin oxide (ITO), indium zinc oxide, or cadmium tin oxide (CTO)).

The common electrode 13 is covered with a sealing film 17. The sealing film 17 prevents water or oxygen from entering the EL elements 11. An upper surface 17a of the sealing film 17 is almost flat. The sealing film 17 passes light and is made of a transparent resin (e.g., acrylic resin (including methacrylate resin) or epoxy resin). The surface 17a of the sealing film 17 constitutes the light emerging surface 2a of the flat display panel 2 in FIG. 1.

The optical sheet 3 will be described next.

A number of microprisms 3a serving as optical elements are formed on one surface or the upper surface of the optical sheet 3. A sheet member 3b having smooth surfaces on both sides is arranged on the lower surfaces of the microprisms 3a. The refractive index of the microprisms 3a preferably equals that of the sheet member 3b. In the optical sheet 3 which is divided into a plurality of parts, i.e., the microprisms 3a and sheet member 3b, the "refractive index of the optical sheet 3" to be described later means a value which is determined in consideration of the refractive indices of the plurality of members serving as the optical path in the optical sheet 3, unless otherwise specified. The optical sheet 3 is much thinner than the sealing film 17. For this reason, even if the plurality of members have slightly different refractive indices, the influence is small, and the optical path does not largely change. All the microprisms 3a are long in a vertical direction. The sectional shape of each microprism taken along a plane perpendicular to the longitudinal direction, i.e., the sectional shape taken along a line B-B is a triangle and, more preferably, an isosceles triangle. The plurality of microprisms 3a are arrayed at an almost equal interval in parallel in the longitudinal direction. All the microprisms 3a have the same sharpness α.

The optical sheet 3 is bonded to the surface 17a of the sealing film 17 via a transparent optical adhesive 4 having optical transparency. Examples of the optical adhesive 4 are Canada balsam, a UV curing epoxy optical adhesive, and a UV curing acrylic optical adhesive. The refractive index of the optical adhesive 4 preferably has an intermediate value of the refractive index of the optical sheet 3 and that of the sealing film 17. As the optical adhesive 4 becomes thick, the color mixture width between the adjacent EL elements 11 in the light emission region of the EL elements increases, and the ratio of light that passes through the optical adhesive 4 decreases. Hence, the optical adhesive 4 is preferably as thin as possible.

For example, the sheet member 3b of the optical sheet 3 is made of polyester (refractive index: 1.58 to 1.68) or polyethylene terephthalate. The microprism 3a is made of acrylic resin (refractive index: 1.49 to 1.51) or UV curing resin. The microprisms 3a and sheet member 3b may be integrally formed by using the same material. Instead of bonding the optical sheet 3 to the surface 17a of the sealing film 17, a number of microprisms 3a may be formed directly on the surface 17a of the sealing film 17 by photolithography.

When the optical sheet 3 is bonded to the light emerging surface 2a of the flat display panel 2, the front directivity of emerging light of the display device 1 increases. When the display device 1 is perpendicularly to its display screen, the display surface looks bright. When the display device 1 is viewed at an angle with respect to the display surface, it looks dark. Using the optical sheet 3 (ctraf (trade name) available from SUMITOMO 3M Limited) having a sharpness α of 70°, the front luminance increased to 1.11 times as compared to a flat display panel having no optical sheet 3. Light beams at 20° and 30° were increased in brightness by 1.13 times. In the optical sheet 3 (befhp (trade name) available from SUMITOMO 3M Limited) having a sharpness α of 90°, the front luminance was increased by 1.18 times as compared to a flat display panel having no optical sheet 3. The brightness of light beams at 20° and 30° was increased by 1.20 times. In the optical sheet 3 (h210 (trade name) available from Mitsubishi Rayon Co., Ltd.) having a sharpness α of 95°, the front luminance was increased by 1.24 times as compared to a flat display panel having no optical sheet 3. The brightness of light beams at 20° and 30° was increased by 1.27 times and 1.26 times, respectively. In the optical sheet 3 (bef100 (trade name) available from SUMITOMO 3M Limited) having a sharpness α of 100°, the front luminance was increased by 1.30 times as compared to a flat display panel having no optical sheet 3. The brightness of light beams at 20° and 30° was increased by 1.30 times and 1.28 times, respectively. In the optical sheet 3 (pv7 (trade name) available from Dai Nippon Printing Co., Ltd.) having a sharpness α of 110°, the front luminance was increased by 1.24 times as compared to a flat display panel having no optical sheet 3. The brightness of light beams at 20° and 30° was increased by 1.28 times and 1.27 times, respectively. As described above, when the sharpness α of the microprism 3a was 70° to 110°, the front directivity of emerging light was increased. When the sharpness α was 100°, the front directivity of emerging light was highest. As a comparative example, in the optical sheet 3 having α sharpness α of 10°, the front luminance was increased to 0.97 times as compared to a flat display panel having no optical sheet 3. The brightness of light beams at 20° and 30° was increased to 0.98 times and 0.99 times, respectively.

In addition, the light extraction ratio from the optical sheet 3 to the outside was increased by the retroreflection effect of the optical sheet 3.

When the optical sheet 3 is arranged, light components emitted from several EL elements 11 sometimes emerge unfortunately from a given point of the surface of the optical sheet 3. The user may recognize it as a mixed color between adjacent pixels on the display screen. A glass substrate having a refractive index of 1.52 and a thickness of 700 μm was used as the sealing film 17. The refractive index of the optical adhesive 4 was set to 1.52. The sheet member 3b having a refractive index of 1.58 and a thickness of 125 μm and the microprisms 3a each having a refractive index of 1.51 and an apex height of 50 μm were used. In this case, the mixed color mixture width was about 400 μm in 1,000 μm, or nearly 600 μm in 1,500 μm.

Figure 3A:
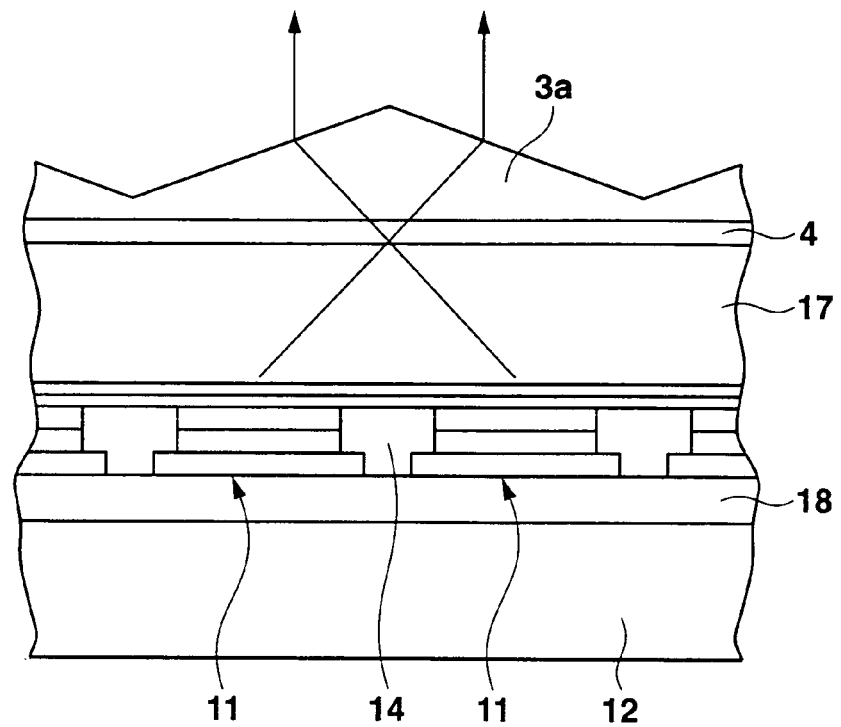
FIGS. 3A and 3B are views for explaining the function of the first embodiment.
Figure 3B:
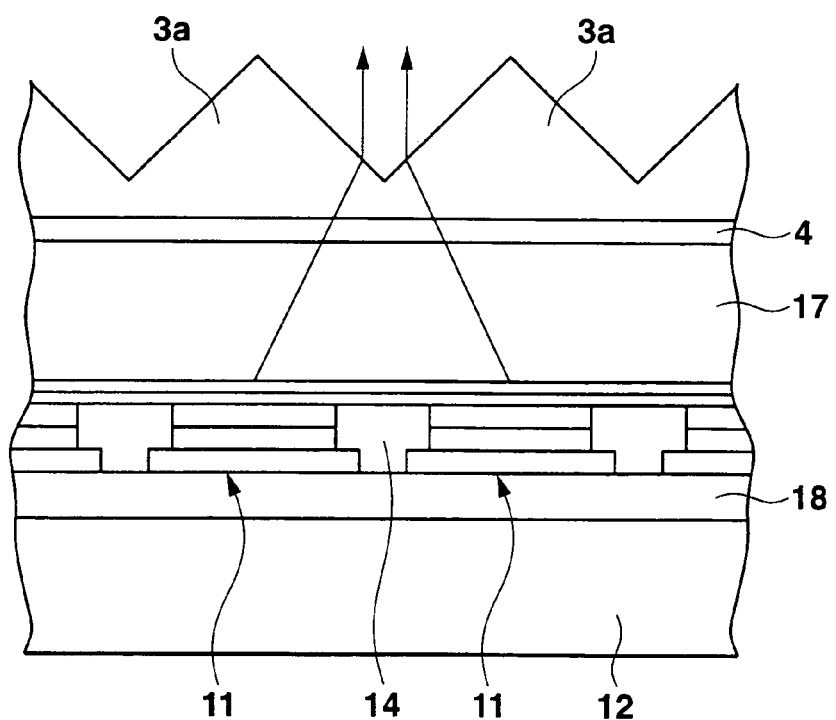

In this embodiment, a pitch a of the microprisms 3a and a pitch b of the pixels are set such that the pitch a (e.g., the distance between apices which define the sharpness α of adjacent microprisms 3a) of the microprisms 3a becomes equal to or smaller than the pitch b of the pixels (EL elements 11). That is, one or more microprisms 3a oppose each pixel. As shown in FIG. 3A, when the pitch a of the microprisms 3a is larger than the pitch b of the pixels, light components emitted from the EL elements 11 adjacent to each other emerge from one microprism 3a. However, as shown in FIG. 3B, when the pitch a of the microprisms 3a is equal to or smaller than the pitch b of the pixels, light components emitted from adjacent EL elements 11 can be eliminated. Light emitted from one EL element 11 emerges from one microprism 3a. Hence, color mixture between adjacent pixels on the display screen can be reduced. The pitch b is the sum of the horizontal width of a pixel and the width of a non-light-emission region between pixels adjacent in the horizontal direction.

Cylindrical lenses each having a semi-circular section or a semi-elliptical section may be formed in place of the microprisms 3a. Even when cylindrical lenses each having a semi-circular section or a semi-elliptical section are formed, a display screen having a high front directivity and no color mixture can be obtained by setting the pitch a of the cylindrical lenses to be smaller than the pitch b of the pixels.

When the microprisms 3a of triangular sections are formed on the optical sheet 3, a vertical height d from a pixel (EL element 11) to a light emerging position where light emitted from the EL layer 15 of the pixel emerges from the outer surface of the optical sheet 3 to the front side except a portion above that pixel (i.e., the sum of the thicknesses of the microprism 3a, sealing film 17, and optical adhesive 4 at the emerging position), a horizontal width p from the pixel to the emerging position, and a refractive index n and sharpness α of the microprism 3a have a relationship given by $$\frac{d}{p} \leq \tan\left\{\frac{\alpha}{2} + \sin^{-1}\left(\frac{1}{n}\sin\frac{\pi-\alpha}{2}\right)\right\} \tag{1}$$

Inequality (1) is satisfied, and the width p is set to the pitch between pixels adjacent to each other. In this case, light components emitted by the EL elements 11 adjacent to each other are mixed and emerge from the surface of the microprism 3a in only a region corresponding to the insulating film 14. In a region corresponding to the EL element 11, light emitted by the adjacent EL element 11 does not emerge from the surface of the microprism 3a. Hence, color mixture on the display screen can be reduced.

Figure 4:
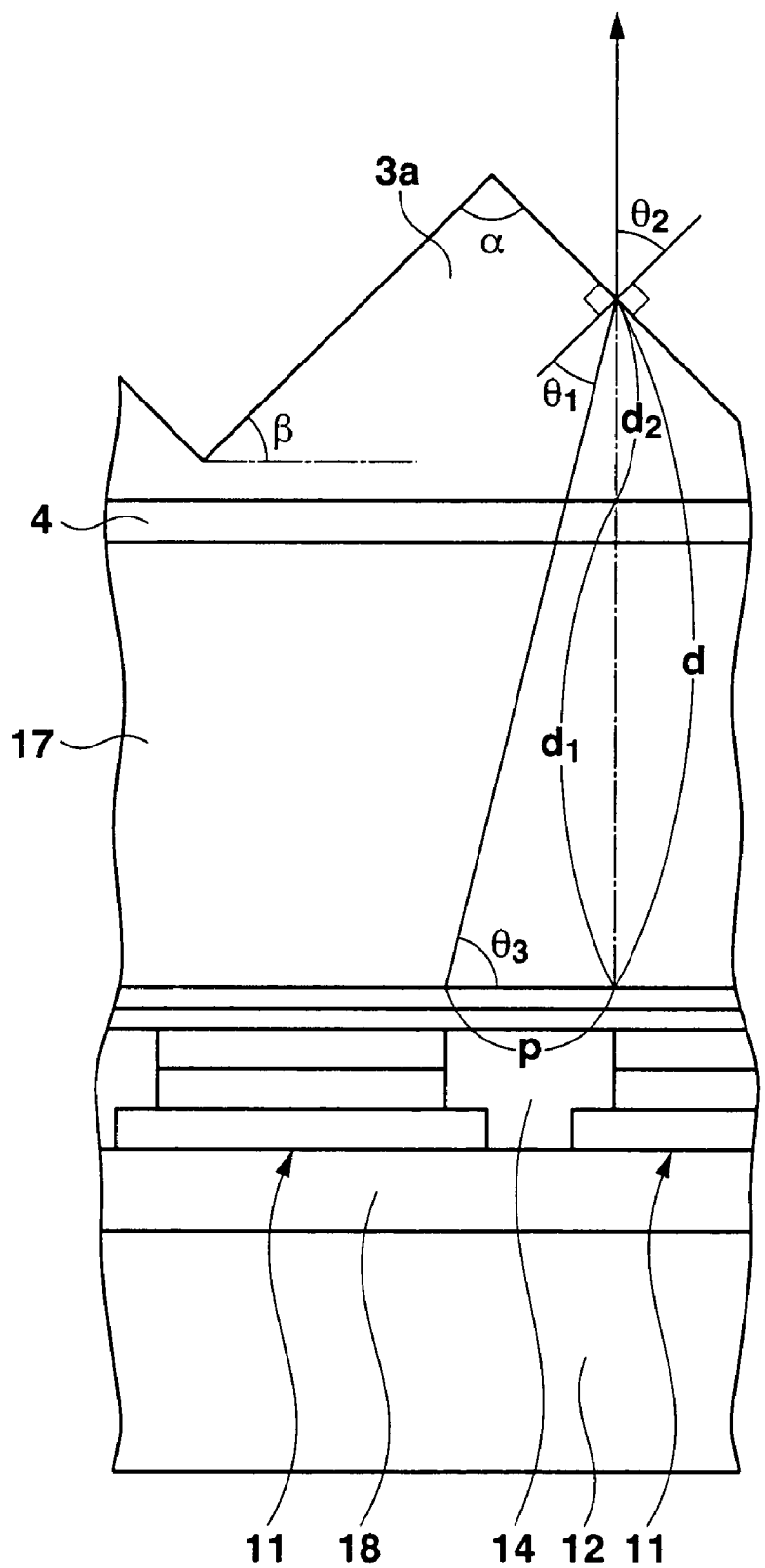
FIG. 4 is a view for explaining inequality (1)

Inequality (1) will be described with reference to FIG. 4. In the following explanation, the unit of angles is radian.

Let $\theta_1$ be the incident angle of light which is emitted from the EL element 11 and reaches the outer surface of the microprism 3a, $\theta_2$ be the emerging angle of the light from the interface of the microprism 3a, and n be the refractive index of the microprism 3a. At this time, equation (2) holds on the basis of the Snell's law. The refractive index of air which is in contact with the surface of the microprism 3a is defined as 1.

$$n \sin\theta_1 = \sin\theta_2 \tag{2}$$

Since the microprism 3a has an isosceles triangular section, a base angle β and the sharpness α have a relationship given by $$\beta = \frac{\pi - \alpha}{2} \tag{3}$$

To make light emerge from the microprism 3a perpendicularly to the display screen, $$\theta_2 = \beta \tag{4}$$

is satisfied.

From equations (2) to (4), we obtain $$\theta_1 = \sin^{-1}\left(\frac{1}{n}\sin\frac{\pi-\alpha}{2}\right) \tag{5}$$

If light emitted from an edge of the EL element 11 should emerge from the surface of the microprism 3a corresponding to an edge of the adjacent EL element 11 at the angle $\theta_2$, $$\tan\theta_3 = \frac{d}{p} \tag{6}$$

$$\theta_3 = \frac{\pi}{2} - \beta + \theta_1 = \frac{\alpha}{2} + \theta_1 \tag{7}$$

are satisfied.

From equations (5) to (7), we obtain $$\frac{d}{p} = \tan\left(\frac{\alpha}{2} + \theta_1\right) = \tan\left\{\frac{\alpha}{2} + \sin^{-1}\left(\frac{1}{n}\sin\frac{\pi-\alpha}{2}\right)\right\} \tag{8}$$

As described above, a value obtained by dividing the vertical height d from a pixel to the outer emerging surface of the optical sheet 3 at a position where light emitted from the EL layer 15 of the pixel emerges from the outer surface of the optical sheet 3 to the front side except a portion above that pixel (i.e., the sum of the thicknesses of the microprism 3a, sealing film 17, and optical adhesive 4 at the emerging position) by the horizontal width p from the pixel to the emerging position is uniquely determined by the refractive index n and sharpness α of the optical sheet 3. The refractive index n and sharpness α are determined by the type of the employed optical sheet 3. That is, when the width p is set on the basis of the panel design, and the refractive index n and sharpness α of the optical sheet 3 are determined, the height d from an EL element 11 to the outer surface of the optical sheet 3 at a position where light emitted from the EL layer 15 of the pixel emerges from the outer surface of the optical sheet 3 to the front side except a portion above that pixel can automatically be calculated.

The height d equals the sum of a height $d_1$, i.e., the sum of the thickness of the optical adhesive 4 and that of the sealing film 17, and a height $d_2$ of the optical sheet 3 at a position shifted from the pixel by the width p. The height $d_2$ of the optical sheet 3 can automatically be calculated on the basis of the relative position between the optical sheet 3 and the flat display panel 2 when the structure of the optical sheet 3 to be applied is determined in advance. Hence, color mixture between the pixels can be suppressed by controlling the height $d_1$, i.e., at least one of the thickness of the optical adhesive 4 and that of the sealing film 17, such that equation (8) is satisfied.

To prevent, of light emitted by the EL layer 15 of a certain pixel, a light component which emerges from the outer surface of the optical sheet 3 to the front side from emerging from the optical sheet 3 corresponding to the position of a pixel adjacent to that pixel, i.e., to design the flat display panel without forming any color mixture portion on the pixels, $$\frac{d}{p} \leq \tan\left(\frac{\alpha}{2} + \theta_1\right) = \tan\left\{\frac{\alpha}{2} + \sin^{-1}\left(\frac{1}{n}\sin\frac{\pi-\alpha}{2}\right)\right\} \tag{9}$$

is set.

A color mixture area can exist on the pixels to some extent as long as the display characteristic does not greatly degrade. That is, the width p may be larger than the distance between pixels adjacent to each other in the horizontal direction. For example, the sealing film 17 having a thickness of 1 µm and made of silicon oxide or zinc oxide and the optical sheet 3 having a height of 20 µm are used in a 2-inch square flat display panel 2 with an RGB stripe array including 128 (rows)×160 (columns). When the ratio of the light emission area of EL pixels to the panel area of the flat display panel 2 is 20% or 60%, the horizontal width of the color mixture area of the pixels is 67 µm or less or 34 µm or less. In a 2-inch square flat display panel 2 with an RGB stripe array including 320 (rows)×240 (columns), when the ratio of the light emission area of EL pixels to the panel area of the flat display panel 2 is 20% or 60%, the horizontal width of the color mixture area of the pixels is 27 µm or less or 13 µm or less. In a 37-inch square flat display panel 2 with an RGB stripe array including 1,365 (rows)×768 (columns), when the ratio of the light emission area of EL pixels to the panel area of the flat display panel 2 is 20% or 60%, the horizontal width of the color mixture area of the pixels is 160 µm or less or 80 µm or less. From the viewpoint of color purity, the width of color mixture caused between the color of light emitted from a given pixel and that of a pixel adjacent in the horizontal direction preferably falls within the range of 20% of the horizontal width of the adjacent pixel.

[First Modification]

Figure 5A:
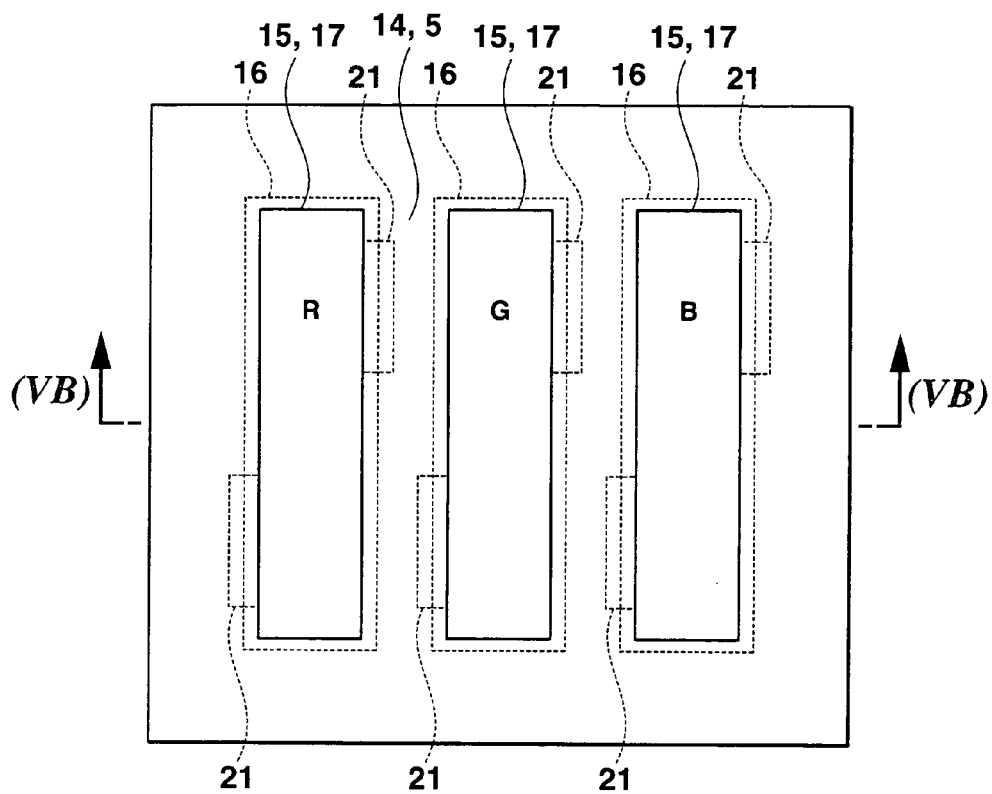
FIG. 5A is a plan view of an EL display device according to the first modification.
Figure 5B:
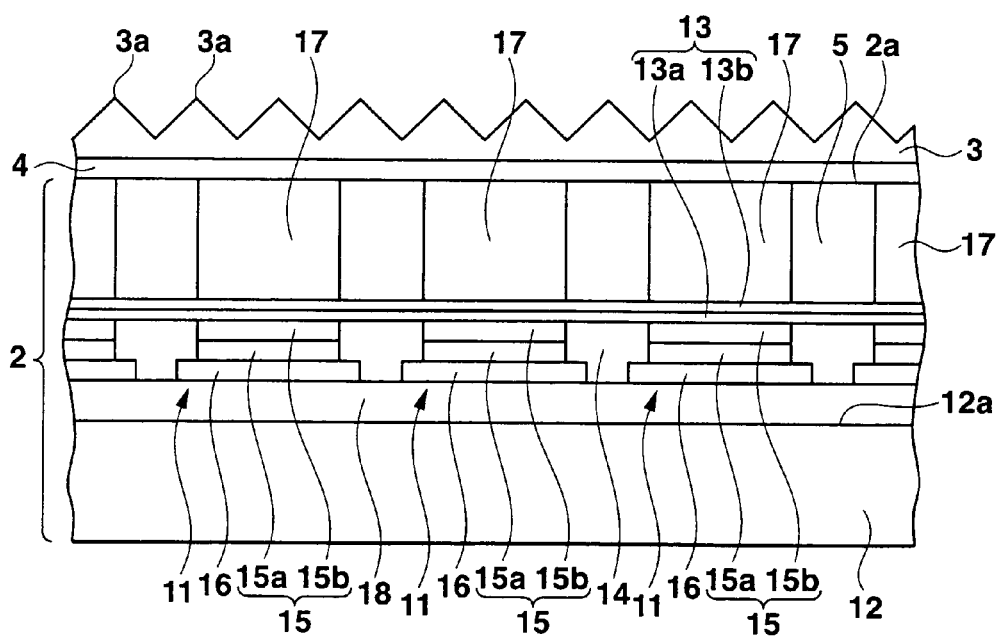
FIG. 5B is a sectional view taken along a line (VB)-(VB) in FIG. 5A.

The first modification will be described below with reference to FIGS. 5A and 5B.

In the display device of the first modification, the sealing film 17 is divided by a partition 5. More specifically, the partition 5 having a mesh shape corresponding to the insulating film 14 when viewed from the upper side is formed on the common electrode 13. When the partition 5 is formed into a mesh shape when viewed from the upper side, a plurality of cells surrounded by portions of the partition 5 are arrayed in a matrix. The EL layer 15 is arranged in each cell when viewed from the upper side. The cells formed by the partition 5 are filled with the sealing film 17. The thickness of a wall of the partition 5 equals that of the sealing film 17. The optical sheet 3 is bonded to the flat surface 2a of the panel 2, which is formed by upper surfaces of the sealing film 17 and partition 5, via the optical adhesive 4. The partition preferably has a light-shielding effect to light emitted by the EL layers 15. Most preferably, the partition 5 has reflecting properties. The display device of the first modification has the same arrangement as the display device 1 shown in FIGS. 2A and 2B except the above-described points.

Light emitted from each EL element 11 is shielded by the partition 5 and therefore does not emerge from a region corresponding to an adjacent EL element 11. Hence, color mixture on the display screen can be reduced. The partition 5 may be entirely made of a metal such as aluminum or an alloy. Alternately, a film of a metal such as aluminum or an alloy may be formed on a surface of a frame of a non-reflect body to form the partition 5. In both cases, the partition 5 acts like a mirror having a high reflectance. Since light emitted from the EL elements 11 is reflected by the partition 5, the light extraction ratio from the optical sheet 3 to the outside increases.

[Second Modification]

Figure 6A:
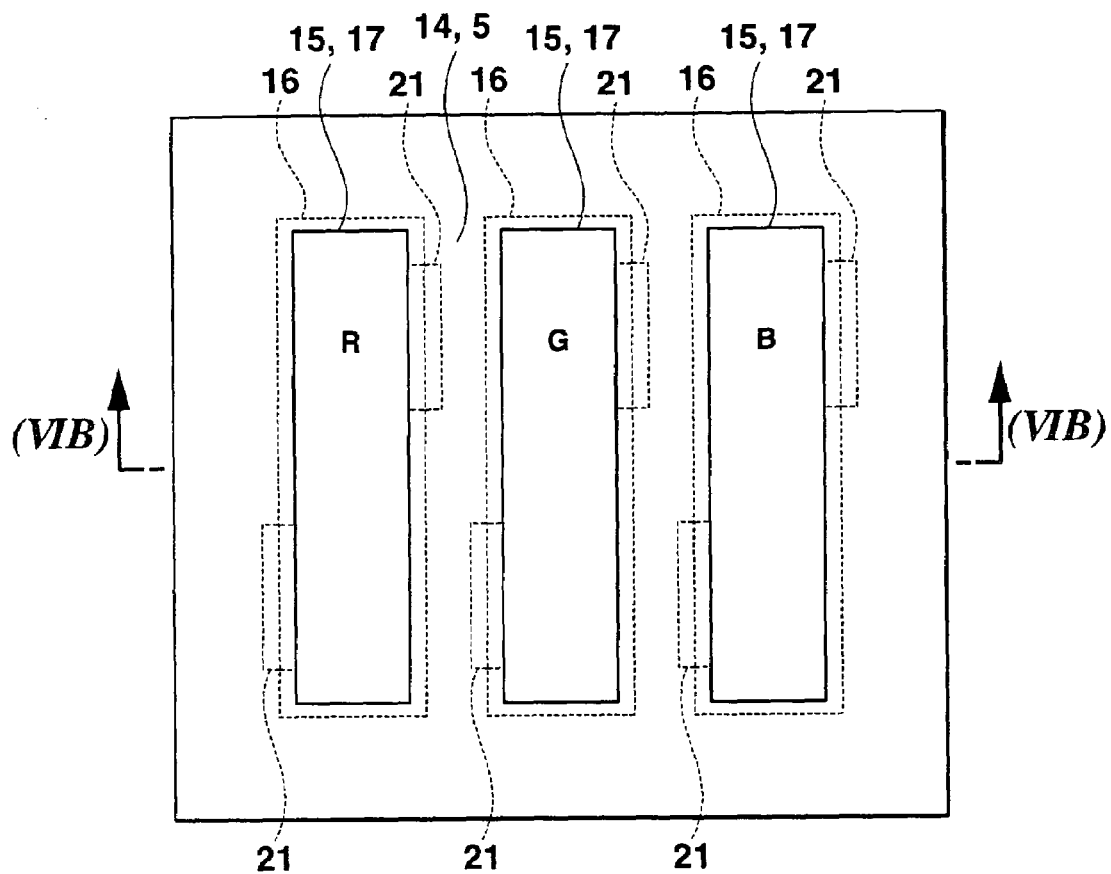
FIG. 6A is a plan view of an EL display device according to the second modification.
Figure 6B:
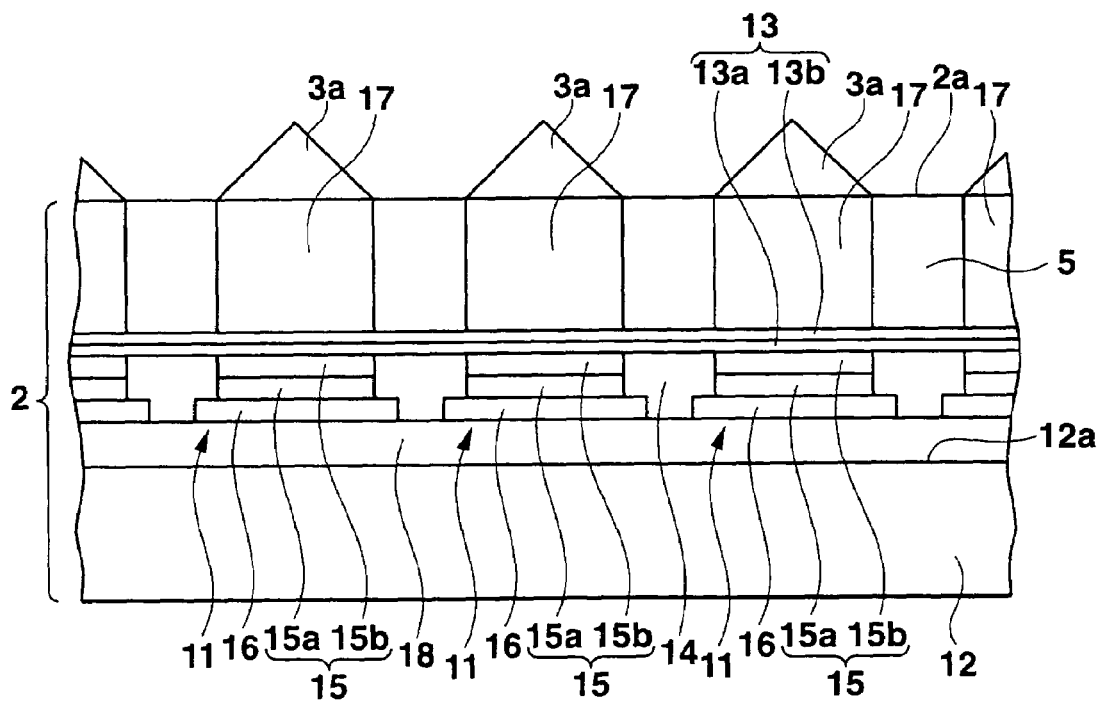
FIG. 6B is a sectional view taken along a line (VIB)-(VIB) in FIG. 6A.

The second modification will be described below with reference to FIGS. 6A and 6B.

In the display device of the first modification, the optical sheet 3 is bonded to the surface 2a of the flat display panel 2. In the display device of the second modification, a number of microprisms 3a are formed directly on the surface 2a of the flat display panel 2 by photolithography, as shown in FIGS. 6A and 6B. Spaces are formed between the microprisms 3a adjacent to each other. The space width equals that of a non-light-emission region between pixels adjacent in the horizontal direction. One microprism 3a opposes pixels of one vertical line. The display device of the second modification has the same arrangement as the display device of the first modification shown in FIGS. 5A and 5B except the above-described points.

[Third Modification]

Figure 7A:
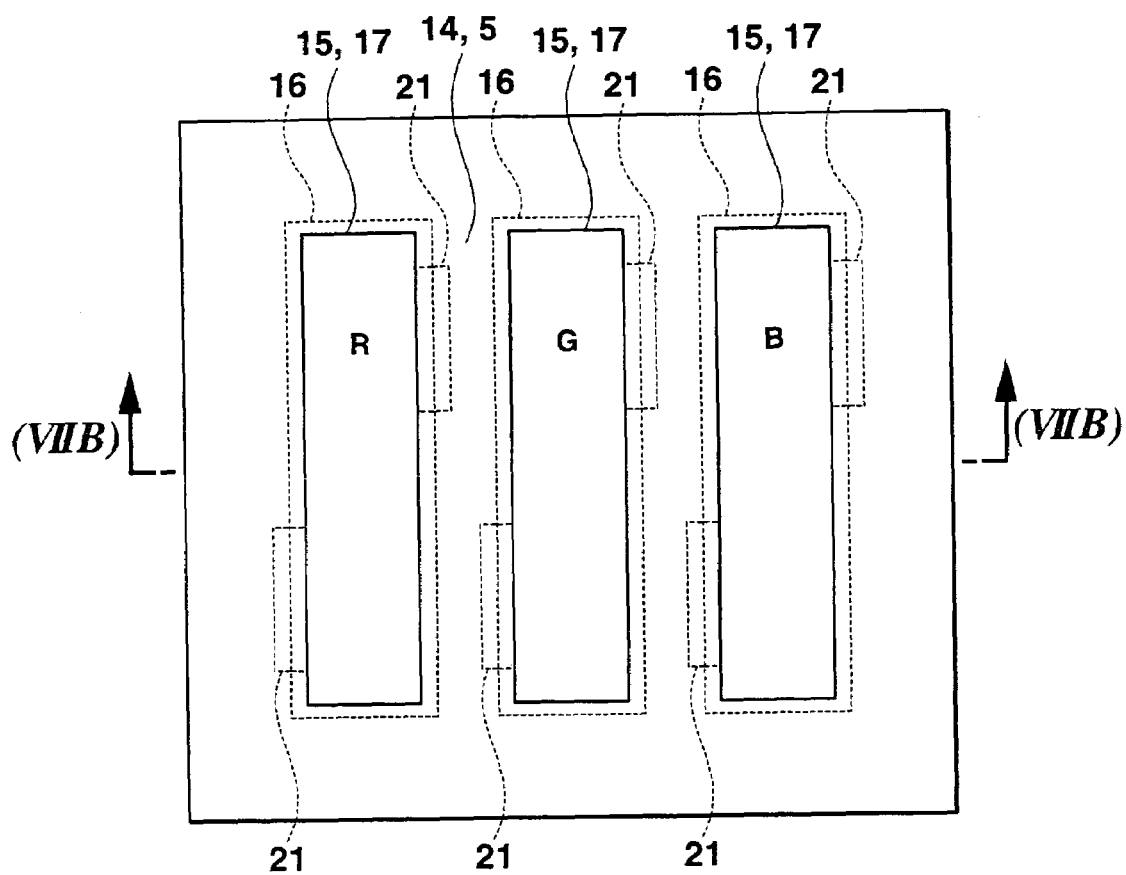
FIG. 7A is a plan view of an EL display device according to the third modification.
Figure 7B:
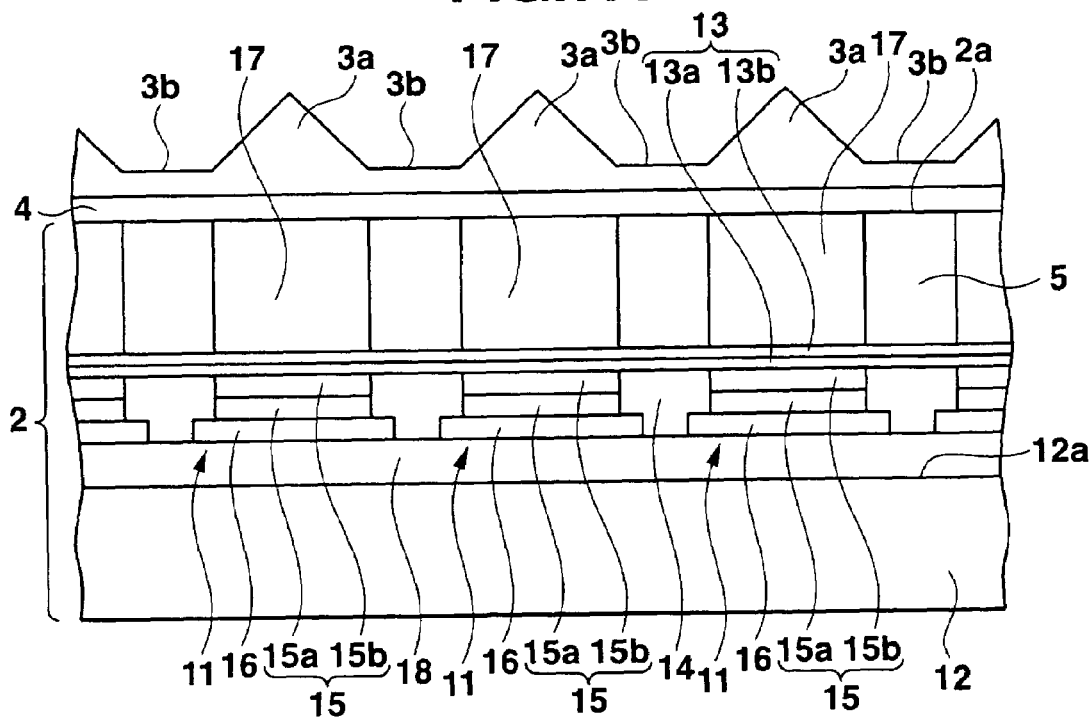
FIG. 7B is a sectional view taken along a line (VIIB)-(VIIB) in FIG. 7A.

The third modification will be described below with reference to FIGS. 7A and 7B.

In the display device of the first modification, no spaces are formed between the adjacent microprisms 3a of the optical sheet 3. The slanting surface on one side of a microprism 3a crosses the slanting surface on the other side of an adjacent microprisms 3a. In the display device of the third modification, as shown in FIGS. 7A and 7B, spaces are formed between the adjacent microprisms 3a of the optical sheet 3. Bottom surfaces 3b almost parallel to the lower surface of the optical sheet 3 are formed between the adjacent microprisms 3a. The slanting surface on one side of a microprism 3a crosses a bottom surface 3b. The slanting surface on the other side of an adjacent microprism 3a crosses the bottom surface 3b. One microprism 3a opposes pixels of one vertical line. The bottom surfaces 3b oppose walls of the partition 5. The display device of the third modification has the same arrangement as the display device of the first modification shown in FIGS. 5A and 5B except the above-described points.

[Fourth Modification]

Figure 8:
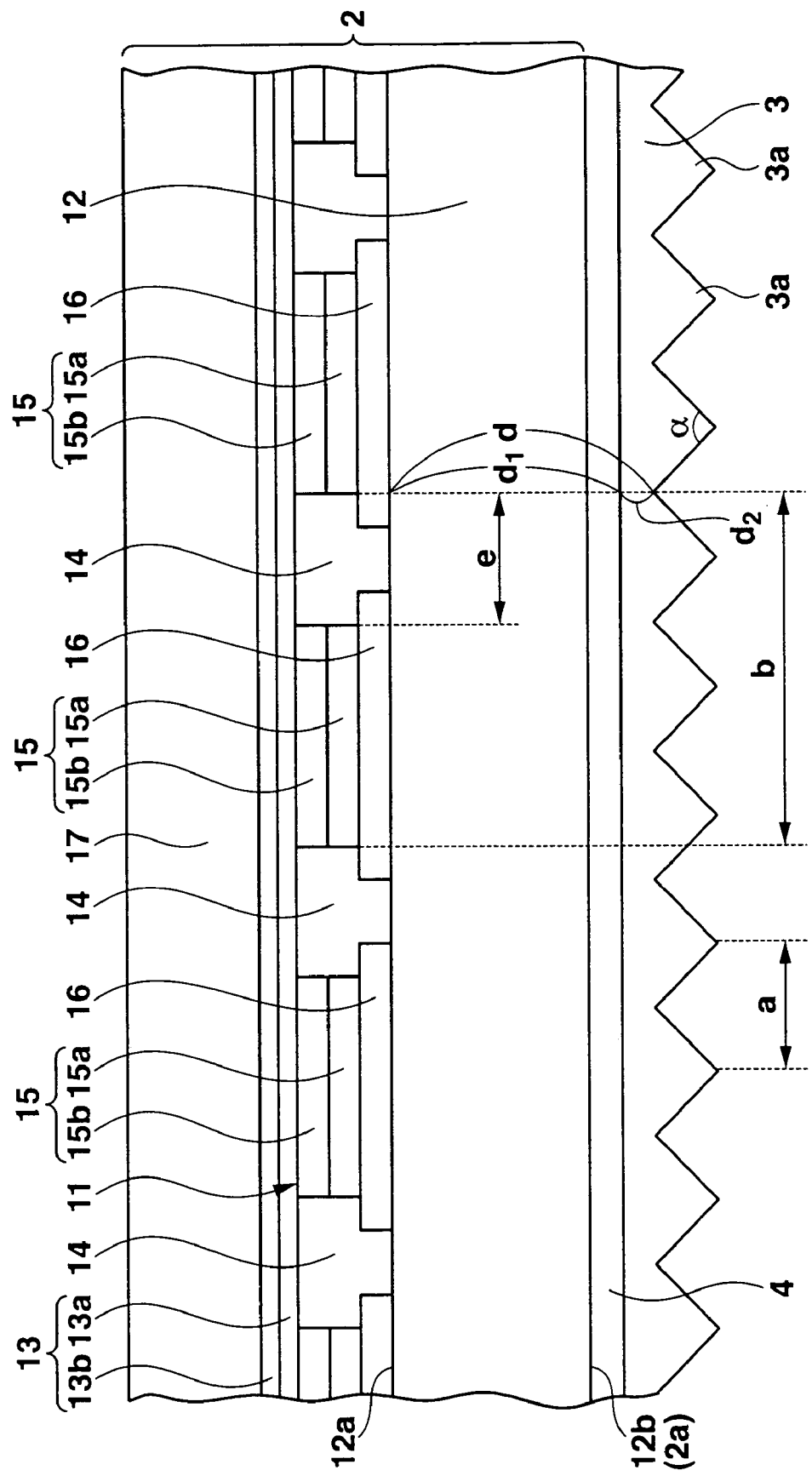
FIG. 8 is a sectional view of a display device according to the fourth modification.

The fourth modification will be described below with reference to FIG. 8.

In the display device 1 shown in FIG. 2, the flat display panel 2 is a so-called top emission panel in which light emerges from the side of the sealing film 17 to the outside. In the display device of the fourth modification, the flat display panel 2 is a so-called bottom emission panel in which light emerges from the side of the substrate 12 to the outside. As shown in FIG. 8, the substrate 12 is a transparent substrate made of, e.g., glass. The pixel electrodes 16 arrayed in a matrix on the substrate 12 are also transparent electrodes made of, e.g., ITO. No insulating coating film 18 between the substrate 12 and pixel electrodes 16 is formed. The transistors 21 are covered with the insulating film 14. The electron injection layer 13a need not be so thin as to pass light. The auxiliary electrode 13b need not particularly be transparent when it is formed from a conductive material such as a metal, a metal oxide, or an alloy.

In the display device of the fourth modification, the light emerging surface 2a of the flat display panel 2 is a lower surface 12b of the substrate 12. The optical sheet 3 is bonded to the lower surface 12b of the substrate 12 via the transparent optical adhesive 4.

The display device of the fourth modification has the same arrangement as the display device 1 shown in FIG. 2 except the above-described points. More specifically, the pitch a of the microprisms 3a and the pitch b of the pixels are set such that the pitch a of the microprisms 3a becomes equal to or smaller than the pitch b of the pixels (EL elements 11). In addition, when the optical sheet 3 to be applied is determined, i.e., the refractive index n and sharpness α of the optical sheet 3 are determined, the height d from the EL element 11, which is necessary for preventing a position where light emitted by the EL layer 15 of the pixel emerges from the outer surface of the optical sheet 3 from overlapping a pixel adjacent in the horizontal direction, can automatically be calculated by substituting a preset width e of a non-light-emission region between pixels adjacent in the horizontal direction as the width p in equation (8) or (9) described above. The height $d_2$ of the optical sheet 3 at a position shifted from a certain pixel by the width e can automatically be calculated when the relative positions of the optical sheet 3 and flat display panel 2 are determined. Hence, color mixture can be prevented by controlling the height $d_1$ as the sum of the thickness of the optical adhesive 4 and that of the substrate 12, i.e., at least one of the thickness of the optical adhesive 4 and that of the substrate 12, such that equation (8) or (9) is satisfied.

To make a design in which no color mixture occurs on the pixels, the width e of the non-light-emission region between the pixels adjacent in the horizontal direction is set to the width p of light emerging outside from the optical sheet 3 to the pixel edge portion, and the pitch b is set to be the sum of the horizontal width of the pixel and the width p.

A color mixture area can exist on the pixels to some extent as long as the display characteristic does not greatly degrade. That is, the width p in equation (8) or (9) may be larger than the width e between the pixels adjacent in the horizontal direction. From the viewpoint of the color purity of pixels, the width of color mixture caused between the color of light emitted from a given pixel and that of a pixel adjacent in the horizontal direction preferably falls within the range of 20% of the horizontal width of the adjacent pixel.

[Fifth Modification]

Figure 9:
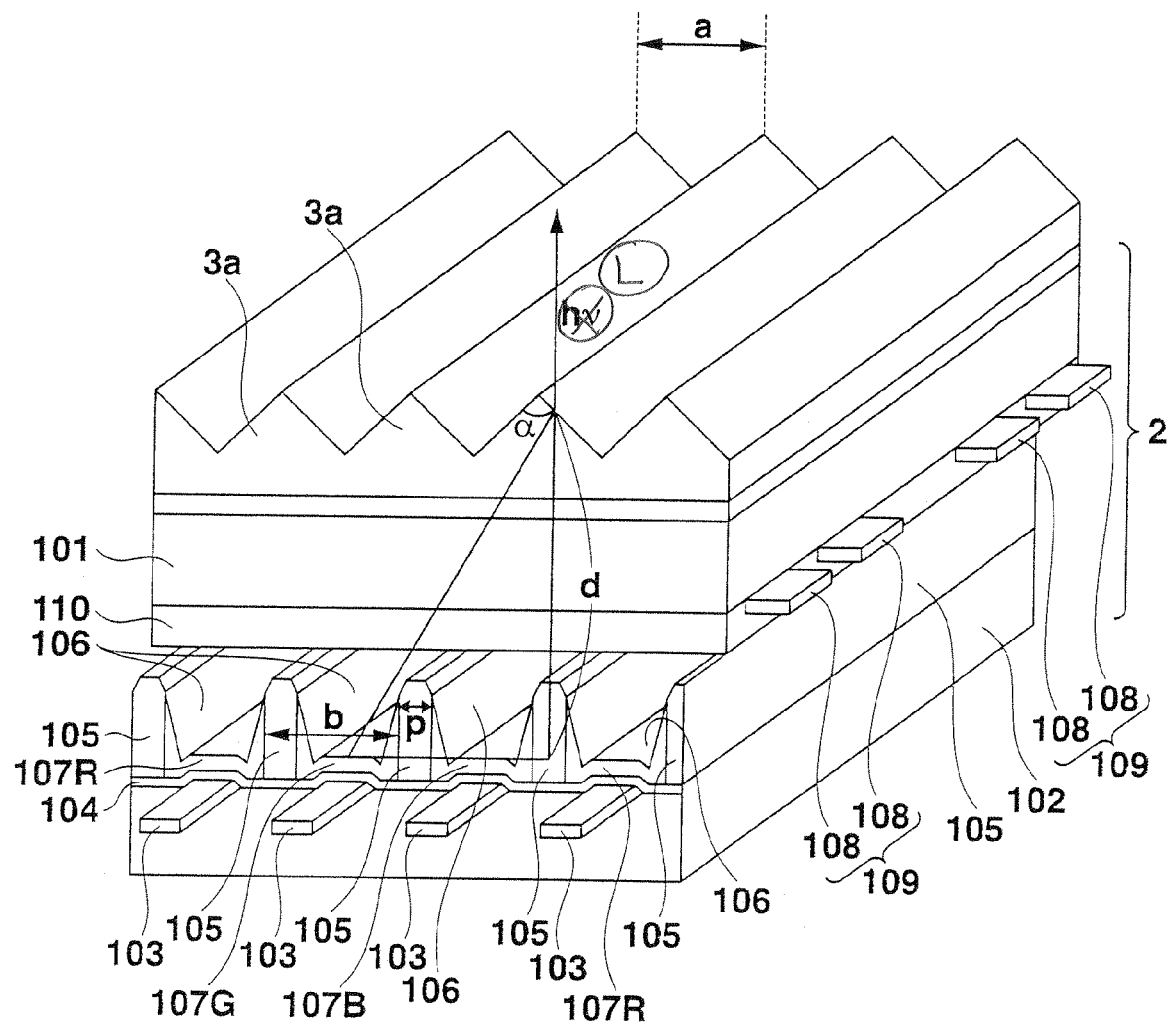
FIG. 9 is a perspective view of a display device according to the fifth modification.

The fifth modification will be described below with reference to FIG. 9.

In the display device 1 shown in FIG. 2, the flat display panel 2 is an EL display panel. In the display device of the fifth modification, the flat display panel 2 is an AC voltage driving plasma display panel, as shown in FIG. 9.

The flat display panel 2 has a front substrate 101 and a back substrate 102, which oppose each other at a predetermined interval. A plurality of address electrodes 103 are formed on a surface of the back substrate 102 on the side of the front substrate 101. The address electrodes 103 are formed into a band shape and arrayed in parallel at a predetermined interval.

An insulating (dielectric) layer 104 is formed over the entire surface of the back substrate 102, on which the address electrodes 103 are formed. Thus, the address electrodes 103 are wholly covered with the insulating layer 104. A plurality of partitions 105 stand on one surface of the insulating layer 104. Each of the partitions 105 is arranged between the adjacent address electrodes 103 to be parallel to them. The partitions 105 divide the space between the substrate 101 and 102. Discharge cells 106 having a stripe arrangement are defined between the partitions 105. The partition 105 is made of an insulating material.

Phosphor layers which emit light upon receiving UV rays are formed on the insulating layer 104 opposing the discharge cells 106 to the side surfaces of the partitions 105. R (red), G (green), and B (blue) added to reference numerals 107 that denote the phosphor layers represent the light emission colors. The phosphor layers 107 are periodically arrayed in the order of R, G, and B.

The front substrate 101 is formed from a transparent material such as glass. A plurality of display electrodes 108 formed into a band shape are arranged on a surface of the front substrate 101, which opposes the back substrate 102, the display electrodes 108 are extended to be perpendicular to the address electrodes 103. Each display electrode 108 is formed from a bus electrode made of, e.g., chromium and a transparent electrode made of, e.g., ITO.

A transparent insulating layer 110 is formed over the entire one surface of the front substrate 101, on which the display electrodes 108 are formed. Thus, the display electrodes 108 are wholly covered with the insulating layer 110. The entire insulating layer 110 may be covered with a thin protective layer.

The surface of the front substrate 101 with the display electrodes 108 is bonded to the surface of the back substrate 102 with the address electrodes 103 while sandwiching the partitions 105 between them so that the discharge cells 106 surrounded by the partitions 105, front substrate 101, and back substrate 102 are formed. The discharge cells 106 are filled with a gas mixture of xenon and neon.

The display electrodes 108 form electrode pairs 109 each including two display electrodes 108 adjacent to each other. The electrode pairs 109 are extended perpendicular to the plurality of address electrodes 103 when viewed from the upper side. The intersections between the electrode pairs 109 and the address electrodes 103 are arrayed in a matrix when viewed from the upper side. Each intersection includes one pixel. When selective discharge is caused at the intersections between the address electrodes 103 and the electrode pairs 109, the phosphor layers 107G, 107B, 107R are excited by the discharge to emit visible light L. The emitted visible light L passes through the insulating layer 110, pixel electrodes 108, and front substrate 101 and emerges from the surface opposing the surface of the front substrate 101 with the display electrodes 108 arranged thereon. Hence, the light emerging surface 2a of the flat display panel 2 is the opposite surface of the surface of the front substrate 101 with the display electrodes 108. To maintain a predetermined luminance, an AC voltage is applied between one display electrode 108 and the other display electrode 108 of each electrode pair 109.

As in the display device 1 shown in FIG. 2, the optical sheet 3 is bonded, via the transparent optical adhesive 4, to the surface opposing to the surface of the front substrate 101 with the display electrodes 108 are provided. The optical sheet 3 is the same as that arranged in the display device 1 shown in FIG. 2. That is, the pitch a of the microprisms 3a and the pitch b (the interval b of the partitions 105) of the pixels are set such that the pitch a becomes equal to or smaller than the pitch b. In addition, the vertical height d from a pixel to the outer emerging point of the optical sheet 3 at a position where light emitted from the phosphor layer 107 of the pixel emerges from the outer surface of the optical sheet 3 to the front side except a portion above that pixel, the horizontal width p from the pixel to the position (if the color of light from an adjacent pixel should not be mixed in the pixels, the width p of the partition 105), and the refractive index n and sharpness α of the microprism 3a have a relationship given by inequality (1) described above.

[Sixth Modification]

Figure 10:
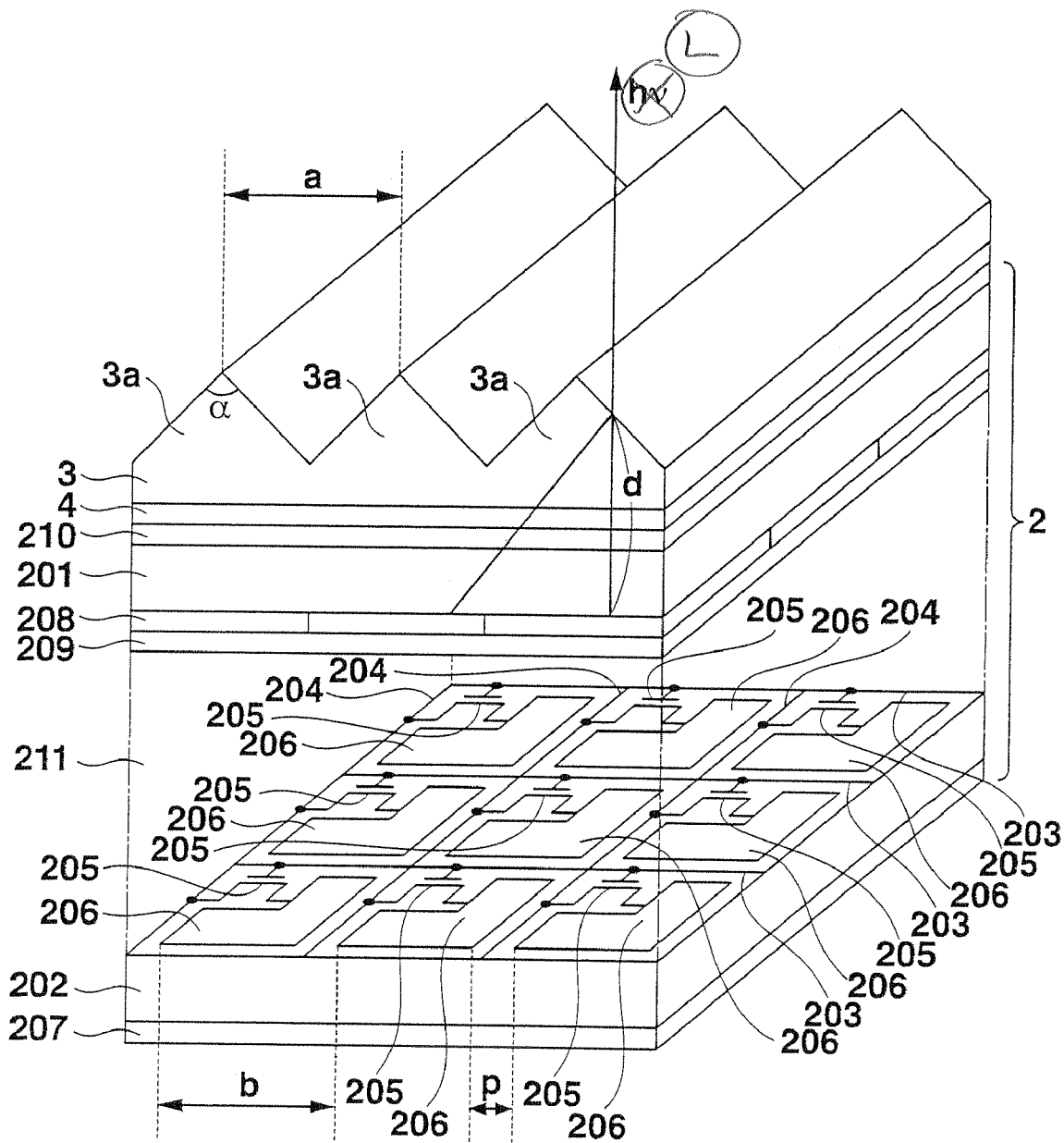
FIG. 10 is a perspective view of a display device according to the sixth modification.

The sixth modification will be described below with reference to FIG. 10.

In the display device 1 shown in FIG. 2, the flat display panel 2 is an EL display panel. In the display device of the sixth modification, the flat display panel 2 is an active matrix driving transmission liquid crystal display panel, as shown in FIG. 10.

The flat display panel 2 has a front substrate 201 and a back substrate 202, which oppose each other at a predetermined interval. Both the substrates 201 and 202 are made of a transparent material such as glass. A plurality of scanning lines 203 are formed on a surface of the back substrate 202 on the side of the front substrate 201. The scanning lines 203 are arrayed in parallel at a predetermined interval. A plurality of signal lines 204 are formed on the surface of the back substrate 202 with the scanning lines 203. The signal lines 204 are arrayed in parallel at a predetermined interval to be perpendicular to the scanning lines 203 when viewed from the upper side. At portions where the scanning lines 203 cross the signal lines 204 when viewed from the upper side, the scanning lines 203 are insulated from the signal lines 204.

MOSFET thin-film transistors 205 are formed at the intersections between the scanning lines 203 and the signal lines 204. A plurality of transparent pixel electrodes 206 made of, e.g., ITO are formed on the surface of the back substrate 202 with the scanning lines 203. The pixel electrodes 206 are arrayed in a matrix when viewed from the upper side. Each pixel electrode 206 forms one pixel.

A polarizing plate 207 opposes the surface opposite to the surface of the back substrate 202 which has the pixel electrodes 206. A backlight (not shown) opposes the opposite surface of the back substrate 202 while sandwiching the polarizing plate 207 between them.

A color filter 208 is arranged on the surface of the front substrate 201 on the side of the back substrate 202. A common electrode 209 is formed on the entire surface of the color filter 208. In the color filter 208, regions that pass red light, regions that pass blue light, and regions that pass green light are periodically arrayed in correspondence with the pixel electrodes 206. The common electrode 209 is made of a transparent conductive material such as ITO. A polarizing plate 210 is arranged on the surface opposite to the surface of the front substrate 201 which has the common electrode 209.

The surface of the front substrate 201 which has the common electrode 209 is bonded to the surface of the back substrate 202 which has the pixel electrodes 206 while sandwiching a spacer (not shown) between them. A liquid crystal 211 is sandwiched between the front substrate 201 and the back substrate 202. When the thin-film transistors 205 at the intersections between the scanning lines 203 and the signal lines 204 are turned on, the orientation of the liquid crystal 211 changes between the common electrode 209 and the pixel electrodes 206 connected to the thin-film transistors 205 so that light emitted from the backlight emerges from the polarizing plate 210. Hence, the light emerging surface 2a of the flat display panel 2 is the surface of the polarizing plate 210.

As in the display device 1 shown in FIG. 2, the optical sheet 3 is bonded, via a transparent optical adhesive, to the outer surface of the polarizing plate 210. The optical sheet 3 is the same as that arranged in the display device 1 shown in FIG. 2. That is, the pitch $a$ of the microprisms 3a and the pitch $b$ of the pixels (pixel electrodes 206) are set such that the pitch $a$ is equal to or smaller than the pitch $b$. In addition, the vertical height $d$ from a pixel to the emerging position of the optical sheet 3 at a position where light passed through the pixel emerges from the outer surface of the optical sheet 3 to the front side except a portion above that pixel (i.e., the sum of the thicknesses of the front substrate 201, polarizing plate 210, optical adhesive 4, and optical sheet 3 at that position), the horizontal width $p$ from the pixel to the emerging position, and the refractive index $n$ and sharpness $\alpha$ of the microprism 3a have a relationship given by inequality (1).

In any of the display devices of the first to sixth modifications, cylindrical lenses each having a semi-circular section or a semi-elliptical section may be formed in place of the microprisms 3a. In this case, inequality (1) need not be satisfied. In addition, the flat display panel 2 can be any one of an EL display panel, a plasma display panel, and a liquid crystal panel. A field emission display panel can also be used.

The present invention will be described below on the basis of a detailed example.

Figure 11:
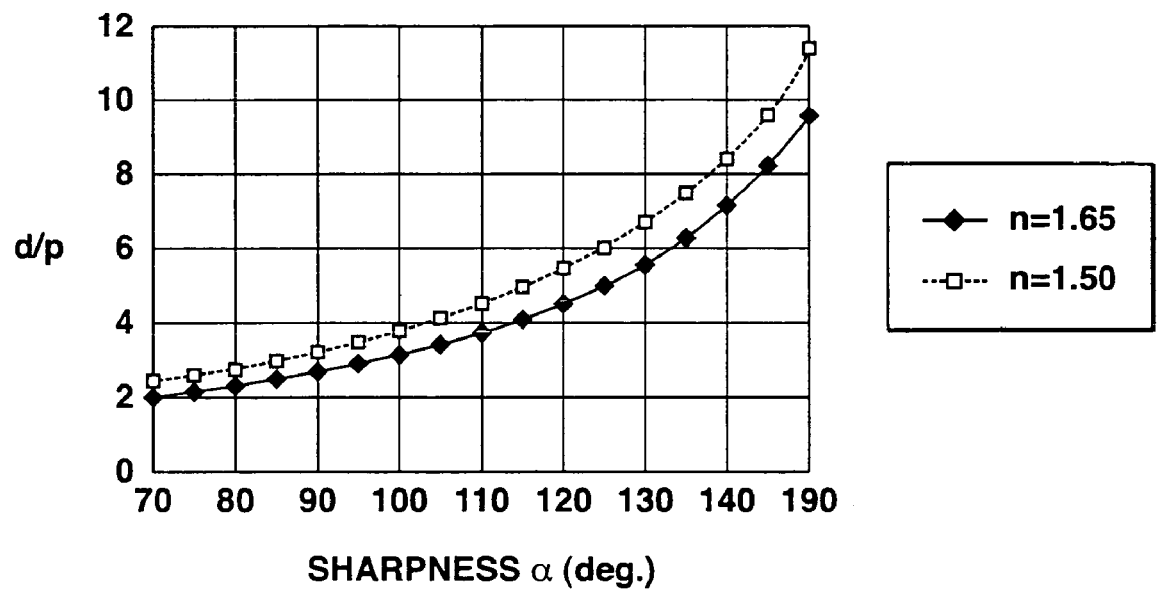
FIG. 11 is a graph showing the relationship between a sharpness α of a prism and d/p.

FIG. 11 is a graph showing the relationship between the sharpness $\alpha$ and d/p based on inequality (1) when the refractive index $n$ of the optical sheet 3 and, more particularly, the microprism 3a in the display device 1 shown in FIG. 2 is 1.65 and 1.50. When the refractive index n of the optical sheet 3 is 1.65, and the sharpness $\alpha$ is 90°, d/p is 2.8, as is apparent from FIG. 11. When p=357 μm, d=1,000 μm. The height $d_2$ is determined by the optical sheet 3 and layout to be applied. Hence, the height $d_2$ is set to satisfy inequality (1).

Figure 12:
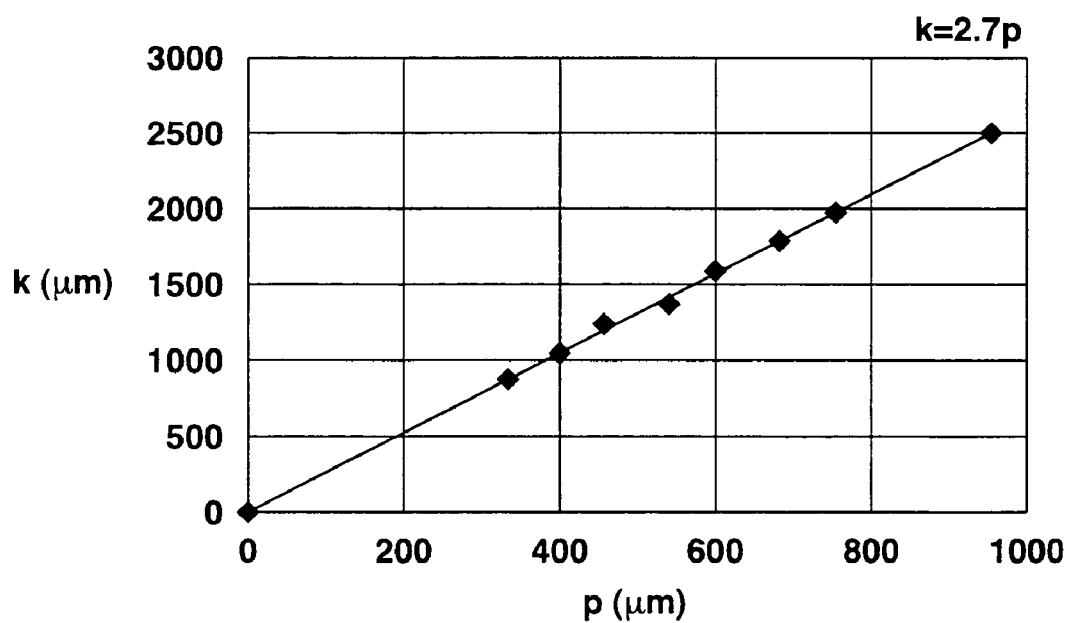
FIG. 12 is a graph showing a thickness $\underline{k}$ and width $\underline{p}$ of an optical adhesive.

For the optical sheet 3, the refractive index n was set to 1.51 to 1.58, the sharpness $\alpha$ was set to 90°, the pitch $a$ was set to 50 μm, the height to the ridge was set to 175 μm, and the height at the valley was set to 125 μm. For the sealing film 17, the thickness was set to 700 μm, and the refractive index was set to 1.52. The thickness $k$ of the optical adhesive 4 having a refractive index of 1.52 was changed to modulate the vertical height $d$ from a pixel to an emerging portion where light emitted from the EL layer 15 of the pixel emerges from the outer surface of the optical sheet 3 to the front side except a portion above that pixel. The horizontal width $p$ from the pixel to the emerging position was measured by experiments. FIG. 12 shows the result. As is apparent from FIG. 12, the thickness $k$ and width $p$ substantially have a relation k=2.7 p. This almost coincides with the relationship between the width $p$ and the sum of the thickness $k$ and the thickness of the sealing film 17, which is indicated by equation (8) or (9). When the width $p$ is the width $e$ of the non-light-emission region between the pixels, no color mixture occurs between adjacent pixels on the display screen.

Second Embodiment

Figure 13:
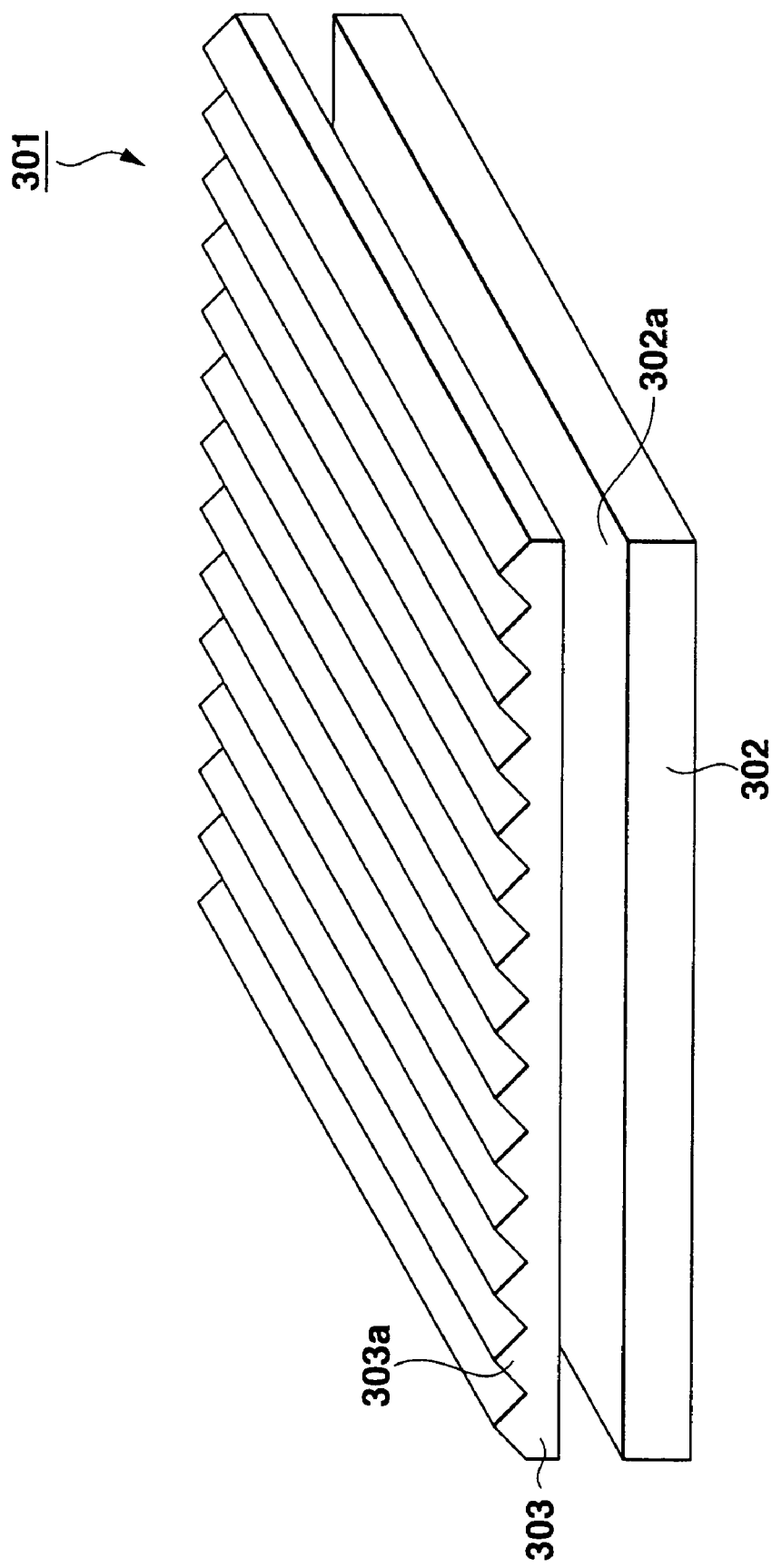
FIG. 13 is an exploded perspective view of an EL display device according to the second embodiment of the present invention.

FIG. 13 is an exploded perspective view of an EL display device 301 to which the present invention is applied. As shown in FIG. 13, the EL display device 301 comprises an EL display panel 302 and a prism sheet 303. In the EL display panel 302, pixels are arrayed in a matrix including i (natural number; i≧2) pixels in the column direction and j (natural number; j≧2) pixels in the row direction. The prism sheet 303 serves as an optical member which is bonded to a light emerging surface (display surface) 302a of the EL display panel 302 to impart a front directivity to its display light. The prism sheet 303 is illustrated thicker than in actual in FIG. 13. Actually, the prism sheet 303 is much thinner than the EL display panel 302. Accordingly, microprisms 303a of the prism sheet 303 are also illustrated large exaggeratingly.

Figure 14A:
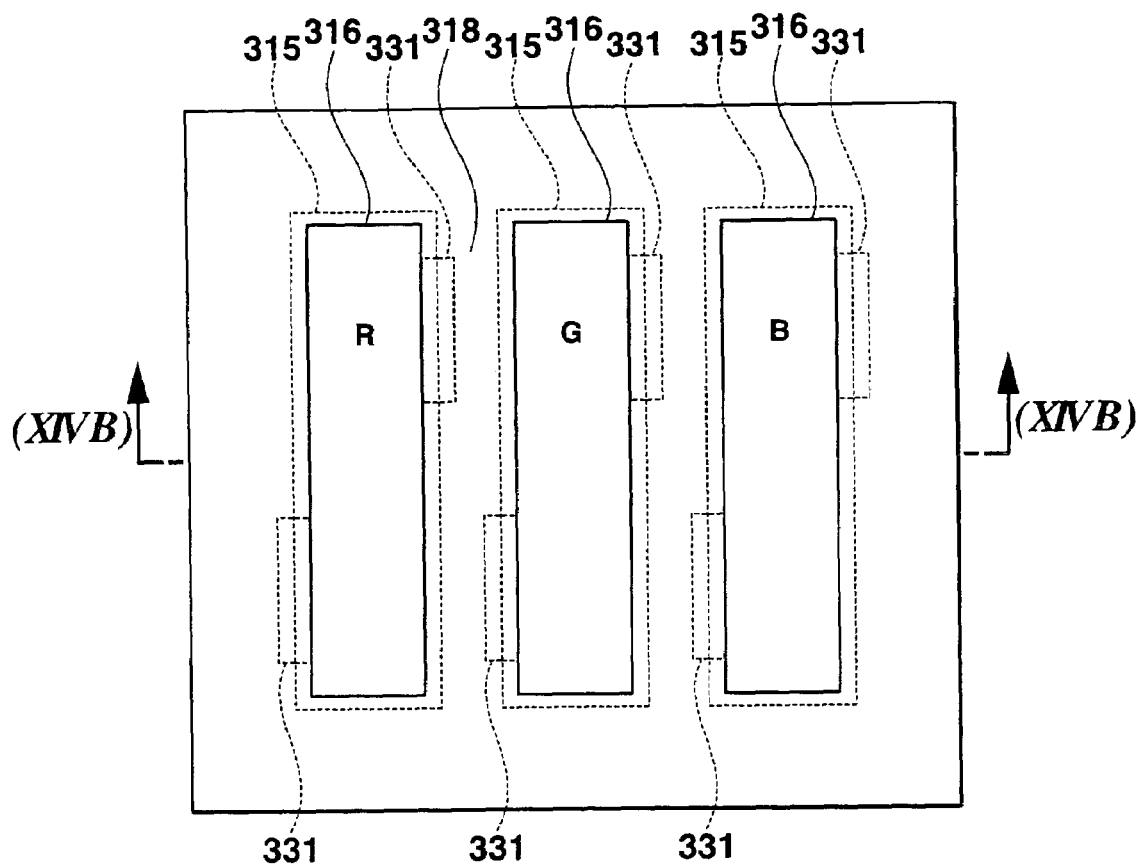
FIG. 14A is a plan view of the EL display device shown in FIG. 13.
Figure 14B:
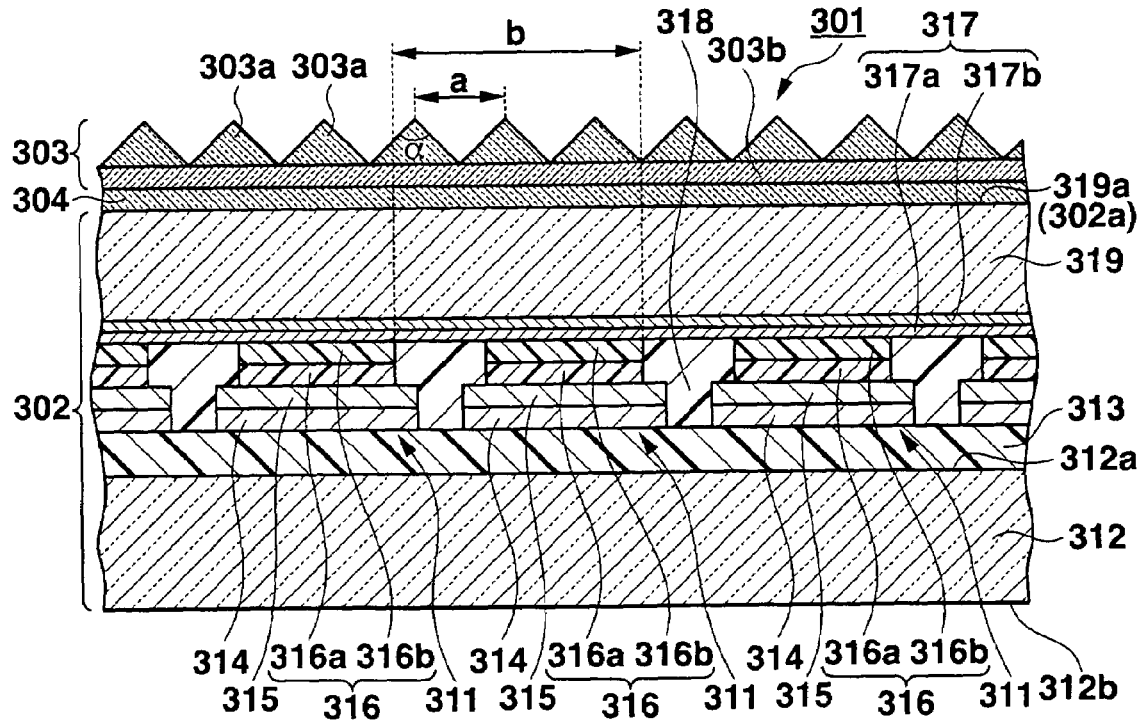
FIG. 14B is a sectional view taken along a line (XIVB)-(XIVB) in FIG. 14A.

The EL display panel 302 will be described with reference to FIGS. 14A and 14B. FIG. 14A is a plan view showing, of the plurality of pixels arrayed in a matrix, three pixels adjacent in the horizontal direction. FIG. 14B is a sectional view taken along a line (XIVB)-(XIVB) in FIG. 14A. Although a substrate 312 and a sealing film 319 are actually much thicker than the remaining layers, they are illustrated thin in FIG. 14B.

As a pixel of the EL display panel 302, an EL element 311 as a selfluminous element is used. Two transistors 331 are arranged in each EL element 311 which forms one pixel. The EL display panel 302 executes dot matrix display by active matrix driving. The EL display panel may be of a current gray level display type which controls the gray level by the current value of a current that flows to one of the transistors 331. Alternatively, the EL display panel may be of a voltage gray level display type which controls the gray level by the voltage value of a voltage applied to one of the transistors 331. The number of transistors per pixel need not always be two and may be three or more.

The EL display panel 302 comprises the substrate 312. The substrate 312 has a flat plate shape and is made of borosilicate glass, silica glass, glass of any other type, PMMA, polycarbonate, or any other resin.

A plurality of scanning lines (not shown) formed into a band shape long in the row direction are arrayed in parallel on a surface 312a of the substrate 312. These scanning lines are covered with an insulating film (not shown). A plurality of signal lines formed into a band shape long in the column direction are arrayed on the insulating film in parallel in a direction perpendicular to the scanning lines. A number of transistors 331 are formed in the surface 312a of the substrate 312. The transistors 331 are MOSFET thin-film transistors. The gate electrode of one of the two transistors 331 in each pixel is connected to the scanning line. The drain electrode of the other transistor 331 is commonly connected to the signal line. The transistor 331 can have either an inverted staggered structure or a coplanar structure. The transistor 331 may be either an n-channel transistor or a p-type transistor. The transistor 331 may be either an amorphous silicon TFT or a polysilicon TFT.

The two transistors 331 in each pixel form a pixel circuit which receives signals for a data driver and a scan driver through the signal line and the scanning line and holds the current value of a current flowing to the EL element 311 in accordance with the received signals until the next period, thereby holding a constant light emission luminance of the EL element 311.

All transistors 331 are covered with an insulating coating film 313. The insulating coating film 313 is formed almost on the entire surface 312a of the substrate 312. Steps generated between the transistors 331 and the surface 312a of the substrate 312 are removed by the insulating coating film 313 so that it has an almost flat surface. The insulating coating film 313 is made of an organic resin (e.g., acrylic resin (including methacrylate resin) or epoxy resin) or an inorganic compound such as silicon oxide or silicon nitride. To prevent photodeterioration of the transistors 331, the insulating coating film 313 preferably has a light-shielding effect by containing a pigment such as carbon black.

The EL elements 311 are formed on the insulating coating film 313. Each of the EL elements 311 has a multilayered structure in which a mirror-like reflecting layer 314 which reflects light, a pixel electrode 315 serving as an anode, an EL layer 316 which causes electroluminescence, and a counter electrode 317 serving as a cathode are formed sequentially from the side of the insulating coating film 313. The reflecting layer 314, pixel electrode 315, and EL layer 316 are formed independently for each EL element 311. The plurality of reflecting layers 314, the plurality of pixel electrodes 315, and the plurality of EL layers 316 are arrayed in a matrix as viewed from the upper side. The counter electrode 317 is formed commonly for all the EL elements 311 and formed over the entire surface of the substrate 312 when viewed from the upper side.

The reflecting layer 314 is made of a material such as a metal or an alloy which has a high reflectance with respect to light from the EL element 311. The reflecting layer 314 is made of, e.g., aluminum. Since the reflecting layer 314 is formed from a conductive material, it assists electrical conduction of the pixel electrode 315 to reduce the resistance even when the sheet resistance of the pixel electrode 315 itself is high. When the reflecting layer 314 is made of an insulating material, it may be formed commonly to all the EL elements 311.

The pixel electrode 315 is made of a transparent conductive material such as a metal oxide or an alloy. The pixel electrode 315 injects holes to the EL layer 316. The pixel electrode 315 is made of, e.g., indium oxide, zinc oxide, or tin oxide, or a mixture containing at least one of them (e.g., indium tin oxide (ITO), indium zinc oxide, or cadmium tin oxide (CTO)). Light in the visible light region is reflected even by the surface of the transparent pixel electrode 315. However, the light reflectance of the pixel electrode 315 itself is lower than that of the reflecting layer 314 itself.

The reflecting layer 314 and pixel electrode 315 are electrically connected to the source electrode of one transistor 331 through a contact hole formed in the insulating coating film 313.

The EL layer 316 is formed on each pixel electrode 315. The EL layer 316 is made of a light-emitting material and emits light by recombining holes injected from the pixel electrode 315 and electrons injected from the counter electrode 317. Referring to FIG. 14A, R (red), G (green), and B (blue) added to the EL elements 311 represent the colors of light emitted by the EL layers 316.

The EL layer 316 may appropriately contain either an electron transport substance or a hole transport substance, or both an electron transport substance and a hole transport substance. More specifically, the EL layer 316 may have a three-layered structure including a hole transport layer, a light-emitting layer, and an electron transport layer sequentially formed from the pixel electrode 315. As shown in FIG. 14B, the EL layer 316 may have a two-layered structure sequentially including a hole transport layer or light-emitting layer 316b and a light-emitting layer or electron transport layer 316b. The EL layer 316 may have a single-layered structure including a light-emitting layer. Alternatively, the EL layer 316 may have a multilayered structure in which an electron or hole injection layer is inserted between appropriate layers in one of the above layer structures. All the layers included in the EL layer 316 may be made of organic compounds. All the layers included in the EL layer 316 may be made of inorganic compounds (e.g., zinc sulfide). The EL layer 316 may be formed by stacking a layer made of an inorganic compound and a layer made of an organic compound. When all the layers included in the EL layer 316 are made of inorganic compounds, an inorganic EL element is formed as the EL element 311. When the EL layer 316 includes a layer made of an organic compound, an organic EL element is formed as the EL element 311.

When the EL layer 316 is made of a low molecular weight organic material or an inorganic substance, the EL layer 316 can be formed by epitaxial growth such as deposition or sputtering. When the EL layer 316 is made of a polymer organic material or a low molecular weight organic material, the EL layer 316 can be formed by applying an organic compound containing liquid (i.e., wet coating). The organic compound containing liquid is a liquid containing an organic compound as the material of the EL layer 316 or its precursor. This liquid may be a solution prepared by dissolving, as a solute, the organic compound as the material of the EL layer 316 or its precursor in a medium. Alternatively, the liquid may be a dispersion prepared by dispersing the organic compound as the material of the EL layer 316 or its precursor in a dispersion medium.

The EL layer 316 is formed by wet coating and has a two-layered structure in which the hole transport layer 316a made of PEDOT (polythiophene) as a conductive polymer and PSS (polystyrene sulfonate) as a dopant, and the light-emitting layer 316b made of a polyfluorene-based light-emitting material are stacked in this order. The light-emitting layers 316b may have different components depending on the light emission colors. However, the hole transport layers 316a are preferably made of the same component independently of the colors. When the EL layer 316 is formed by wet coating, preferably, a lyophilic film having a characteristic (to be referred to as a "lyophilic effect" hereinafter) in that the film surface wets well with a liquid at a contact angle of 40° or less is formed on the pixel electrode 315, and in this state, an organic compound containing liquid is applied to the lyophilic film.

An insulating film 318 made of a material selected from a photosensitive resin such as polyimide, silicon oxide, and silicon nitride is formed around the EL layers 316. When the insulating film 318 is formed into a mesh shape as viewed from the upper side, a plurality of regions surrounded by the insulating film 318 are arrayed in a matrix, and the EL layers 316 are formed in the surrounded regions. Part of the insulating film 318 overlaps part of the edge of each pixel electrode 315. When the EL layer 316 is to be formed by wet coating, a liquid-repellent film (e.g., a fluorocarbon resin film or a reactive silicon film) having a characteristic (to be referred to as "liquid repellency" hereinafter) representing that the film surface repels a liquid and wets with it at a contact angle of 50° or more may be formed on the surface of the insulating film 318.

The counter electrode 317 is formed on the EL layers 316. The counter electrode 317 is formed almost over the entire surface of the substrate 312. The counter electrode 317 has a multilayered structure having an electron injection layer 317a and an auxiliary electrode 317b sequentially formed from the side of the EL layers 316. The electron injection layer 317a is thin enough to pass light and is made of a material having a relatively low work function (e.g., a single metal including magnesium, calcium, lithium, barium, or a rare earth metal, or an alloy containing at least one of these single substances). The electron injection layer 317a has a thickness less than the visible light wavelength range, i.e., of 10 to 200 nm. The auxiliary electrode 317b is conductive and transparent to visible light. The auxiliary electrode 317b is made of, e.g., indium oxide, zinc oxide, or tin oxide, or a mixture containing at least one of them (e.g., indium tin oxide (ITO), indium zinc oxide, or cadmium tin oxide (CTO)). Hence, the counter electrode 317 is an optically transparent electrode that passes light.

The pixel electrode 315 functions as an optical interference film which weakens light of a predetermined wavelength by an interference function and prevents light reflection on the surface. Hence, the pixel electrode 315 is a reflection suppressing electrode which prevents reflection of light of a predetermined wavelength. More specifically, assume that light having a predetermined wavelength becomes incident from the EL layer 316 on the pixel electrode 315. The pixel electrode 315 has an optical thickness which shifts the phase of light propagating in the EL layer 316 and passing through the pixel electrode 315 again by $\pi$ from the phase of light propagating through the EL layer. These light components interfere with each other and attenuate in the pixel electrode 315. Let $n_1$ be the refractive index of the EL layer 316 (particularly, the hole transport layer 316a), $\underline{d}$ be the thickness of the pixel electrode 315, and $n_2$ be the refractive index of the pixel electrode 315. Light having a wavelength $\lambda$ interferes on the surface of the pixel electrode 315 under the following conditions.

Condition (A): When $n_1 > n_2$, the interface between the pixel electrode 315 and the EL layer 316 is a free end. Light is reflected by the interface. In this case, light which interferes on the surface of the pixel electrode 315 has the wavelength $\lambda$ given by $$\lambda = \frac{4n_2 d}{2m} \tag{10}$$

where m is a natural number.

Condition (B): When $n_1 < n_2$, the interface between the pixel electrode 315 and the EL layer 316 is a fixed end. Light is reflected by the interface. In this case, light which interferes on the surface of the pixel electrode 315 has the wavelength $\lambda$ given by $$\lambda = \frac{4n_2 d}{2m+1} \tag{11}$$

where $\underline{m}$ is a natural number.

When the pixel electrode 315 has a single-layered structure including a transparent conductive layer, and reflection of light having the wavelength $\lambda$ as a central wavelength should be suppressed by interference, the thickness $\underline{d}$ and refractive index $n_2$ of the pixel electrode 315 are optically designed such that equation (10) or (11) is satisfied. On the other hand, when the pixel electrode 315 includes a plurality of transparent conductive layers (transparent conductive layers adjacent to each other have different refractive indices), there are a plurality of central wavelengths to be interfered because the interference function occurs in each interface. For this reason, reflection of light in the entire visible light region is suppressed.

Especially, to efficiently cancel light by light interference, the pixel electrode 315 and EL layer 316 are optically designed such that $n_1 = 3 n_2$ is satisfied.

This relationship is obtained in the following way.

Let $W_1$ be the amplitude of light which becomes incident from the EL layer 316 on the pixel electrode 315. An amplitude $W_2$ of light reflected by the interface between them is given by $W_1 \times (n_1 - n_2)/(n_1 + n_2)$. An amplitude $W_3$ of refracted light is given by $W_1 \times 2 n_2/(n_1 + n_2)$. Refracted light is reflected by the reflecting layer 314 and becomes incident on the interface between the pixel electrode 315 and the EL layer 316. If the refracted light should interfere with the reflected light having the amplitude $W_2$, and the light components should completely cancel each other, $W_3 = W_2$. Hence, $n_1 = 3 n_2$.

The counter electrode 317 is covered with the sealing film 319. The sealing film 319 is formed over the entire surface of the substrate 312. Steps generated by the counter electrode 317 are canceled by the sealing film 319 so that it has an almost flat upper surface 319a. The sealing film 319 passes light and is made of a transparent resin (e.g., acrylic resin (including methacrylate resin) or epoxy resin). The sealing film 319 is an optically transparent member. The surface 319a of the sealing film 319 constitutes the light emerging surface 302a of the EL display panel 302 in FIG. 13.

The prism sheet 303 will be described next.

A number of microprisms 303a serving as optical elements are formed on the surface of the prism sheet 303. A sheet member 303b having smooth surfaces on both sides is arranged on the lower surfaces of the microprisms 303a. The refractive index of the microprisms 303a preferably equals that of the sheet member 303b. In the prism sheet 303 which is divided into a plurality of parts, i.e., the microprisms 303a and sheet member 303b, the "refractive index of the prism sheet 303" to be described later means a value which is determined in consideration of the refractive indices of the plurality of members serving as the optical path in the prism sheet 303, unless otherwise specified. The prism sheet 303 is much thinner than the sealing film 319. For this reason, even when the plurality of members have slightly different refractive indices, the influence is small, and the optical path does not largely change. The lower surface of the prism sheet 303 is smooth. All the microprisms 303a are long in the vertical direction. The sectional shape of each microprism taken along a plane perpendicular to the longitudinal direction, i.e., the sectional shape taken along a line (XIVB)-(XIVB) is a triangle and, more preferably, an isosceles triangle. The plurality of microprisms 303a are arrayed at an almost equal interval in parallel in the longitudinal direction. A pitch a of the microprisms 303a is equal to or smaller than a pitch b of the pixels (EL elements 311). All the microprisms 303a have the same sharpness α.

The prism sheet 303 is bonded to the surface 319a of the sealing film 319 via an optical adhesive 304 having optical transparency. Examples of the optical adhesive 304 are Canada balsam, a UV curing epoxy optical adhesive, and a UV curing acrylic optical adhesive. The refractive index of the prism sheet 303, that of the optical adhesive 304, and that of the sealing film 319 are preferably approximate to each other. The thicker the optical adhesive 304, the greater the color mixture width between the adjacent EL elements 311 in the light emission region of the EL elements, and the lower the ratio of light that passes through the optical adhesive 304. Hence, the optical adhesive 304 is preferably as thin as possible.

For example, the sheet member 303b of the prism sheet 303 is made of polyester (refractive index: 1.58 to 1.68) or polyethylene terephthalate. The microprism 303a is made of acrylic resin (refractive index: 1.49 to 1.51) or UV curing resin. The microprisms 303a and sheet member 303b may be integrally formed by using the same material. Instead of bonding the prism sheet 303 to the surface 319a of the sealing film 319, a number of microprisms 303a may be formed directly on the surface 319a of the sealing film 319 by photolithography.

When the prism sheet 303 is bonded to the light emerging surface 302a of the EL display panel 302, the front directivity of emerging light of the EL display device 301 increases. When the EL display device 301 is viewed from the front side to its display screen, the display surface looks bright. When the EL display device 301 is viewed at a predetermined tilt angle with respect to the display surface, it looks dark. Especially, when the sharpness α of the microprism 303a is 70° to 110°, the front directivity of emerging light increases. When the sharpness α is substantially 100°, the front directivity is highest.

The pitch a of the microprisms 303a is equal to or smaller than the pitch b of the pixels. Accordingly, any color mixture between adjacent pixels on the display screen or image shift on the display screen can be prevented.

In addition, by the retroreflection effect of the prism sheet 303, light emitted from the EL layer 316 of a given EL element 311 is reflected by the surface of the microprism 303a and becomes incident on another EL element 311. The light that strikes another EL element 311 becomes incident on the pixel electrode 315 of that EL element 311. However, since the interference function occurs on the surface of the pixel electrode 315, as described above, the light is not reflected by the pixel electrode 315. The light that becomes incident on another EL element 311 due to the retroreflection effect of the prism sheet 303 does not mix with light emitted by the EL layers 316 of the neighboring EL elements 311. For this reason, no color mixture occurs, and a clear image can be implemented without damaging the color tone of each pixel.

The present invention is not limited to the above embodiment, and various changes and modifications in design can be made without departing from the spirit and scope of the present invention.

For example, in the above embodiment, the pixel electrode 315 prevents surface reflection by interference. The pixel electrode 315 may prevent surface reflection by forming it using a black body (light absorber) such as chromium oxide, chromium, or carbon fiber. In this case, the mirror-like reflecting layer 314 need not be formed.

A number of microprisms 303a each having a triangular section are arrayed on the prism sheet 303. However, a number of cylindrical lenses each having a semi-circular section may be arrayed in place of the microprisms 303a. Even when cylindrical lenses each having a semi-circular section are formed, a display screen having a high front directivity and no color mixture can be obtained.

In the above embodiment, the prism sheet 303 is bonded to the light emerging surface 302a of the EL display panel 302 to impart the front directivity of emerging light. Not the prism sheet 303 but another optical member may be arranged on the light emerging surface 302a of the EL display panel 302. For example, to prevent surface reflection (glare) on the flat display panel 2, a polarizing film, anti-glare film, or anti-reflection film may be bonded to the light emerging surface 302a of the EL display panel 302. A polarizing coating, anti-glare coating, or anti-reflection coating, which has the same optical function as that of a film, may be formed directly on the light emerging surface 302a of the EL display panel 302. In either case, a clear image without color mixture can be implemented by the interference function of the pixel electrodes 315.

In the above embodiment, the counter electrode 317 serves as a cathode, and the pixel electrode 315 serves as an anode. Conversely, the counter electrode 317 may serve as an anode, and the pixel electrode 315 may serve as a cathode. That is, the counter electrode 317 may include a transparent conductive layer made of, e.g., ITO, and the pixel electrode 315 may have a multilayered structure having a transparent auxiliary electrode and an electron injection layer stacked in this order from the side of the reflecting layer 314. In this case, the stacking order of the hole transport layer 316a and light-emitting layer 316b also changes. The EL layer 316 has a multilayered structure having a light-emitting layer and a hole transport layer stacked in this order from the side of the pixel electrode 315. The auxiliary electrode also functions as a light interference film which causes interference with light from the light-emitting layer.

In the above embodiment, the EL element 311 includes the pixel electrode 315, EL layer 316, and counter electrode 317 in this order from the side of the substrate 312. Conversely the counter electrode, EL layer, and pixel electrode may be formed sequentially from the side of the substrate 312. In this case, when the counter electrode serves as a cathode, the EL element 311 has a multilayered structure including a reflecting layer (common or independent), a transparent auxiliary electrode (common), an electron injection layer (common), a light-emitting layer (independent), a hole transport layer (independent), and a transparent pixel electrode (independent) serving as an anode stacked in this order from the side of the substrate 312. The auxiliary electrode functions as a light interference film. When the counter electrode serves as an anode, the EL element 311 has a multilayered structure including a reflecting layer (common or independent), a transparent counter electrode (common) serving as an anode, a hole transport layer (independent), a light-emitting layer (independent), an electron injection layer (independent) and an auxiliary electrode (independent) stacked in this order from the side of the substrate 312. The counter electrode functions as a light interference film. The notes in parentheses represent whether the layer is formed independently for each EL element 311 or commonly for all the EL elements 311.

In either case, of the two electrodes of each EL element, the electrode on the side of the light emerging surface 302a is an optically transparent electrode, and the electrode on the side of the reflecting layer is a reflection suppressing electrode serving as a light interference film.

Thied Embodiment

The third embodiment to which the present invention is applied will be described net.

Figure 15A:
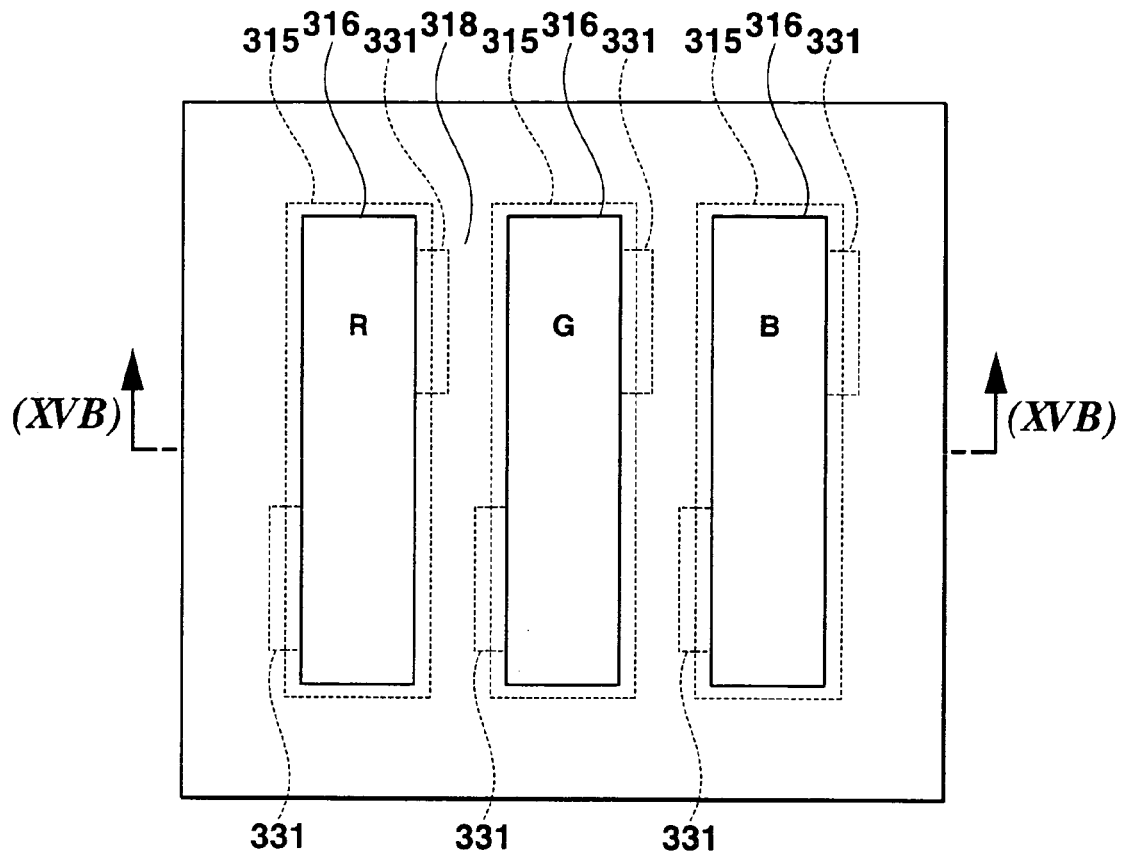
FIG. 15A is a plan view showing an EL display device according to the third embodiment.
Figure 15B:
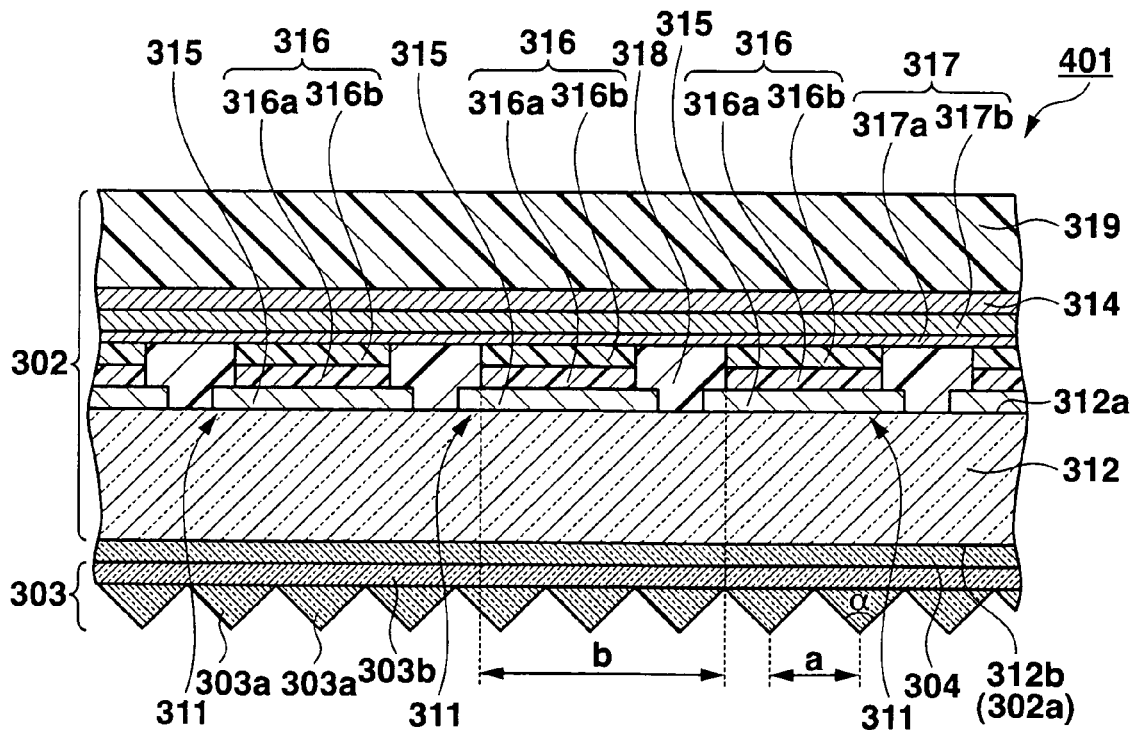
FIG. 15B is a sectional view taken along a line (XVB)-(XVB) in FIG. 15A.

In the EL display device 301 according to the second embodiment, the EL display panel 302 is a so-called top emission panel in which light emerges outside from the side of the sealing film 319. In an EL display device 401 according to the third embodiment, however, an EL display panel 302 is a so-called bottom emission panel in which light emerges outside from the side of a substrate 312, as shown in FIGS. 15A and 15B. Hence, a lower surface 312b of the substrate 312 is a light emerging surface 302a. Differences between the EL display device 301 of the second embodiment and the EL display device 401 of the third embodiment will be described below in detail. The same reference numerals as in the EL display device 301 of the second embodiment denote the same parts in the EL display device 401 of the third embodiment.

The substrate 312 is a transparent substrate made of, e.g., acrylic resin. Neither an insulating coating film 313 nor a reflecting layer 314 is formed on the side of the substrate 312. A plurality of pixel electrodes 315 are arrayed in a matrix on the substrate 312. In the third embodiment, the substrate 312 is an optically transparent member.

As in the second embodiment, an EL element 311 has a multilayered structure in which the pixel electrode 315, an EL layer 316, and a counter electrode 317 are stacked sequentially from the side of the substrate 312. The pixel electrode 315 and EL layer 316 are formed independently for each EL element 311. The counter electrode 317 is formed commonly for all the EL elements 311. In the third embodiment, the pixel electrode 315 is an optically transparent electrode, and the counter electrode 317 is a reflection suppressing electrode.

More specifically, the pixel electrode 315 is a transparent electrode made of, e.g., ITO. Since no reflecting layer 314 is formed under the pixel electrode 315, it does not function as a light interference film. As in the second embodiment, the EL layer 316 has a multilayered structure including a hole transport layer 316a and a light-emitting layer 316b stacked in this order from the side of the pixel electrode 315. The counter electrode 317 has a multilayered structure including an electron injection layer 317a and an auxiliary electrode 317b stacked in this order from the side of the EL layers 316. The electron injection layer 317a is thin enough to pass light and is made of a material having a relatively low work function. The auxiliary electrode 317b is a transparent electrode made of, e.g., ITO. Light in the visible light region is reflected even by the surface of the transparent auxiliary electrode 317b. However, the light reflectance of the auxiliary electrode 317b itself is lower than that of a reflecting layer 314 itself.

The reflecting layer 314 is formed solid on the entire surface of the auxiliary electrode 317b. The reflecting layer 314 is formed commonly for all the EL elements 311. The reflecting layer 314 is made of a high-reflectance material (e.g., aluminum) such as a metal or an alloy. A solid sealing film 319 is formed over the entire surface of the reflecting layer 314.

In the above arrangement, the counter electrode 317 and, more particularly, the auxiliary electrode 317b functions as an optical interference film which weakens light of a predetermined wavelength by an interference function and prevents light reflection. More specifically, let $n_1$ be the refractive index of the EL layer 316 (particularly, the light-emitting layer 316b), $d$ be the thickness of the auxiliary electrode 317b, and $n_2$ be the refractive index of the auxiliary electrode 317b. Light having a wavelength $\lambda$ interferes on the interface between the auxiliary electrode 317b and the electron injection layer 317a under the following conditions.

Condition (A): When $n_1>n_2$, light which interferes has the wavelength $\lambda$ given by $$\lambda = \frac{4n_2 d}{2m} \tag{12}$$

Condition (B): When $n_1<n_2$, light which interferes has the wavelength $\lambda$ given by $$\lambda = \frac{4n_2 d}{2m+1} \tag{13}$$

where $m$ is a natural number.

To efficiently cancel light by light interference, the auxiliary electrode 317b and EL layer 316 are optically designed such that $n_1 = 3\, n_2$ is satisfied.

When the auxiliary electrode includes not a transparent conductive layer having a single-layered structure but a plurality of transparent conductive layers, the wavelength range of light whose reflection is to be suppressed is increased.

In the EL display device 401 of the third embodiment, the light emerging surface 302a of the EL display panel 302 is the lower surface 312b of the substrate 312. Hence, a prism sheet 303 is bonded to the lower surface 312b of the substrate 312 via a transparent optical adhesive 304. In place of the prism sheet 303, a polarizing film, anti-glare film, or anti-reflection film may be bonded to the light emerging surface 302a of the EL display panel 302. A polarizing coating, anti-glare coating, or anti-reflection coating, which has the same optical function as that of a film, may be formed directly on the light emerging surface 302a of the EL display panel 302. Of the two electrodes of each EL element 311, the pixel electrode 315 on the side of the light emerging surface 302a is a first electrode, and the counter electrode 317 (more particularly, the auxiliary electrode 317b) on the side of the reflecting layer is a second electrode serving as a light interference film.

In the EL display device 401 of the third embodiment, since the lower surface 312b of the substrate 312 is the light emerging surface 302a, the sealing film 319 need not be transparent.

Except the above-described points, the EL display device 401 has the same arrangement as that of the EL display device 301 shown in FIGS. 14A and 14B. A clear image without color mixture can be implemented also for the EL display device 401.

In the above description, the auxiliary electrode 317b prevents surface reflection by interference. However, the pixel electrode 315 may prevent surface reflection by forming the auxiliary electrode 317b using a black body such as chromium oxide, chromium, or carbon fiber. In this case, the mirror-like reflecting layer 314 need not be formed.

The present invention will be described below in more detail on the basis of examples.

Figure 16:
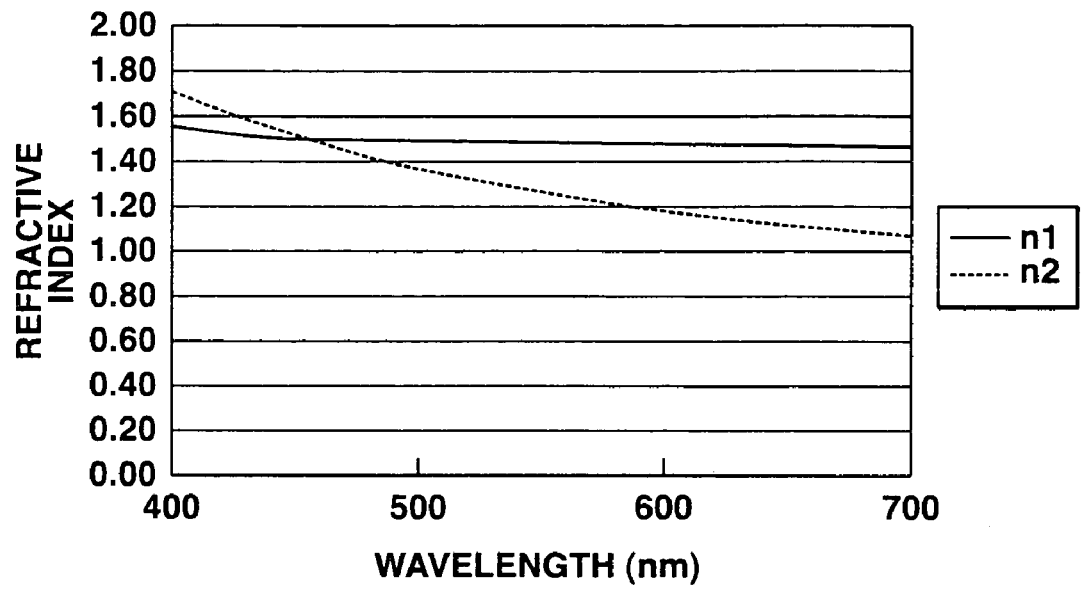
FIG. 16 is a graph showing the relationship between a wavelength and the refractive index of a pixel electrode and the relationship between a wavelength and the refractive index of a hole transport layer.
Figure 17:
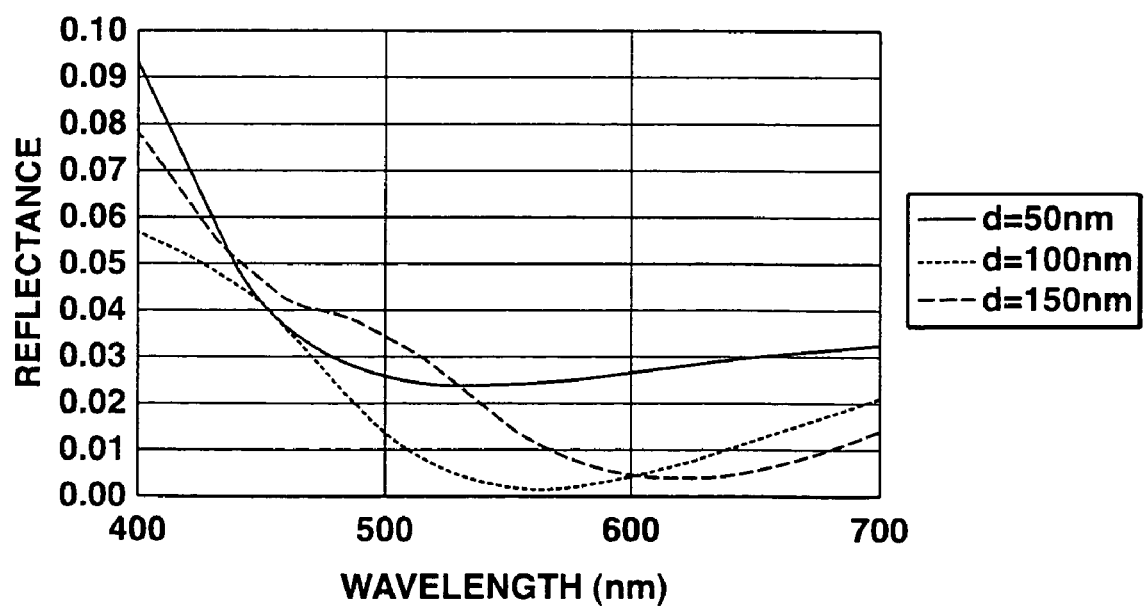
FIG. 17 is a graph showing the relationship between a wavelength and the reflectance of the pixel electrode when the pixel electrode and hole transport layer shown in FIG. 16 are used.

FIG. 16 is a graph showing the relationship between a wavelength and the refractive index $n_2$ of the pixel electrode 315 which functions as an interference film in the EL display device 301 shown in FIGS. 14A and 14B, and the relationship between a wavelength and the refractive index $n_1$ of the hole transport layer 316a as a film whose lower surface is in contact with the pixel electrode 315. FIG. 17 is a graph showing the relationship between a wavelength and the reflectance on the surface of the pixel electrode 315 when the pixel electrode having the refractive index and the hole transport layer 316a having a thickness of 50 nm are used, and the thickness d of the pixel electrode 315 is changed to 50 nm, 100 nm, and 150 nm. As is apparent from FIG. 17, when the pixel electrode 315 and hole transport layer 316a had the refractive indices shown in FIG. 16, the EL display device 301 in which the pixel electrode 315 had the thickness d of 100 nm exhibited a low reflectance to the visible light wavelength region (mainly 400 to 650 nm) with a high spectral luminous efficiency. That is, the interference function efficiently occurred.

The invention claimed is:

1. A display device comprising:
   a flat display panel which includes a plurality of pixels that are arrayed in a matrix at an interval, and which includes an optically transparent material covering the pixels; and
   an optical sheet which imparts a front directivity to light emerging from the flat display panel, and which includes a plurality of prisms each having a bottom surface which receives light from the pixels and a top surface from which light emerges imparted with the front directivity, wherein the prisms are continuous with one another so that a light emerging position of the top surface has no flat portion and has a shape of a sharpness angle α;
   wherein a vertical height d from a given pixel to a corresponding light emerging position is set to satisfy $$\frac{d}{p} \leq \tan\left\{\frac{\alpha}{2} + \sin^{-1}\left(\frac{1}{n}\sin\frac{\pi-\alpha}{2}\right)\right\} \quad (1)$$

where:
   n is a refractive index of an optical path from the pixel to the light emerging position; and
   p is a horizontal width from the pixel to the light emerging position.

2. A device according to claim 1, wherein the width p is not more than a width from the pixel to a neighboring pixel.

3. A device according to claim 2, wherein the flat display panel comprises an electroluminescence display panel in which the pixels comprise electroluminescence elements; and
   wherein a width of the pixel is a width of light emission of the electroluminescence element, and the width from the pixel to the neighboring pixel is a width of a non-light-emission region between electroluminescence elements adjacent to each other where no light emission occurs.

4. A device according to claim 1, wherein a pitch of the plurality of prisms is smaller than a pitch of the plurality of pixels.

5. A device according to claim 1, wherein the flat display panel comprises a mesh-shaped partition which defines a plurality of cells arrayed in a matrix in correspondence with said plurality of pixels; and
   wherein the optically transparent material fills the plurality of cells.

6. A device according to claim 4, wherein each of the plurality of prisms has a triangular shape in cross-section and the plurality of prisms are arrayed in parallel to each other on a surface of the optically transparent material.

7. A device according to claim 1, wherein each of the pixels comprises an optically transparent electrode which passes light, an EL layer which causes electroluminescence, and a reflection suppressing layer to suppress reflection of light on an interface with the EL layer; and
   wherein the optically transparent electrode, the EL layer and the reflection suppressing layer are positioned sequentially from one side of the optically transparent material.

8. A device according to claim 7, wherein the reflection suppressing layer comprises an electrode.

9. A device according to claim 7, wherein the reflection suppressing layer has a thickness of 50 to 150 nm.

10. A device according to claim 7, wherein the reflection suppressing layer has an optical thickness which makes light entering the reflection suppressing layer from the EL layer and propagating in the EL layer again have a phase opposite to a phase of light propagating in the EL layer.

11. A device according to claim 7, wherein the reflection suppressing layer comprises a black body which absorbs light.

12. A device according to claim 1, wherein each of the plurality of prisms has a semi-circular shape in cross-section.

13. A device according to claim 1, wherein each of the plurality of prisms has a semi-elliptical shape in cross-section.

* * * * *